United States Patent [19]

Miyakawa et al.

[11] Patent Number: 5,053,841
[45] Date of Patent: Oct. 1, 1991

[54] NONVOLATILE SEMICONDUCTOR MEMORY

[75] Inventors: Tadashi Miyakawa; Masamichi Asano, both of Tokyo; Tadayuki Taura, Kawasaki; Atsushi Shoji, Yokohama; Michiharu Inami, Tama, all of Japan

[73] Assignee: Kabushiki Kaisha Toshiba, Kawasaki, Japan

[21] Appl. No.: 423,362

[22] Filed: Oct. 18, 1989

[30] Foreign Application Priority Data

Oct. 19, 1988 [JP] Japan .................. 63-263164

[51] Int. Cl.⁵ .............. H01L 29/68; H01L 29/06; H01L 29/78
[52] U.S. Cl. ...................... 357/23.5; 357/6; 357/23.8; 357/23.11; 357/23.14; 357/41; 357/45
[58] Field of Search .............. 357/23.5, 6, 23.8, 23.11, 357/23.14, 41, 45, 50

[56] References Cited

U.S. PATENT DOCUMENTS

| 4,451,904 | 5/1984 | Sugiura et al. | 357/23.5 |
| 4,466,081 | 8/1984 | Masuoka | 365/218 |
| 4,531,203 | 7/1985 | Masuoka et al. | 357/23.5 |
| 4,597,060 | 6/1986 | Mitchell et al. | 365/185 |
| 4,803,529 | 2/1989 | Masuoka | 357/23.5 |
| 4,853,895 | 8/1989 | Mitchell et al. | 357/23.5 |

FOREIGN PATENT DOCUMENTS

| 61-131486 | 6/1986 | Japan | 357/23.5 |
| 63-45862 | 2/1988 | Japan | 357/23.5 |
| 63-45863 | 2/1988 | Japan | 357/23.5 |

Primary Examiner—Andrew J. James
Assistant Examiner—Ngan Van Ngo
Attorney, Agent, or Firm—Finnegan, Henderson, Farabow, Garrett, and Dunner

[57] ABSTRACT

A nonvolatile semiconductor memory includes a cell array in which electrically erasable programmable nonvolatile semiconductor memory cells, each using a cell transistor having source and drain regions in a semiconductor substrate, and a gate electrode with a three-layered structure on the semiconductor substrate are arranged in a matrix form. In the gate electrode having the three-layered structure, a first-layer floating gate electrode opposes a semiconductor substrate surface through a first gate insulating film, and a second- or third-layer gate electrode serves as one of erase and control gate electrodes. The erase gate electrode opposes a part of the floating gate electrode through a tunnel insulating film, and the control gate electrode opposes the floating gate electrode through a second gate insulating film. The erase and control gate electrodes are arranged to be parallel to each other, and to be perpendicular to the source and drain regions. Of two cell transistors adjacent to each other in a length direction of the channel region, the source region of one cell transistor is common to the drain region of the other cell transistor, and the cell transistors adjacent to each other in the widthwise direction of the channel region are element-isolated by an element isolation region formed in the semiconductor substrate between the channel regions.

6 Claims, 25 Drawing Sheets

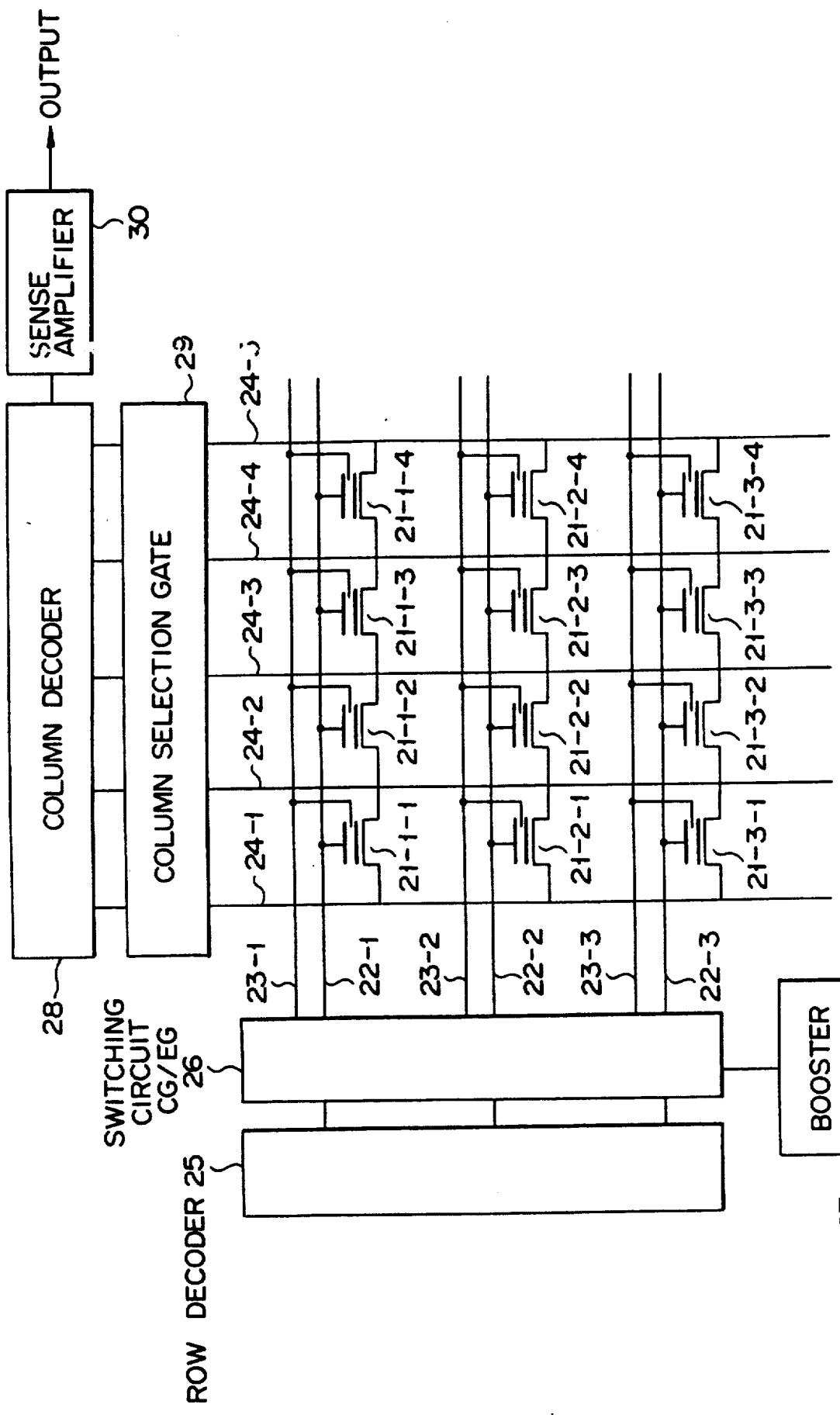

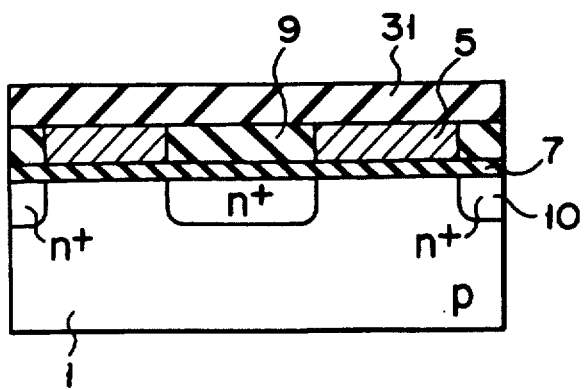
F I G. 6A
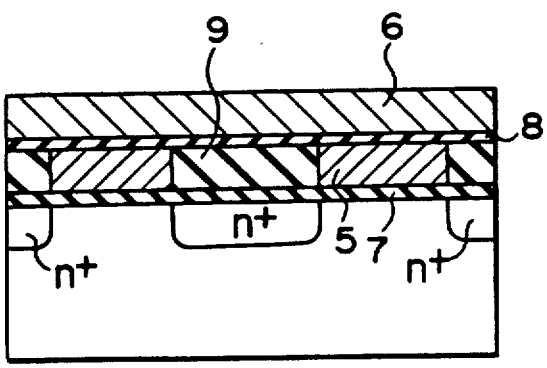
F I G. 6D
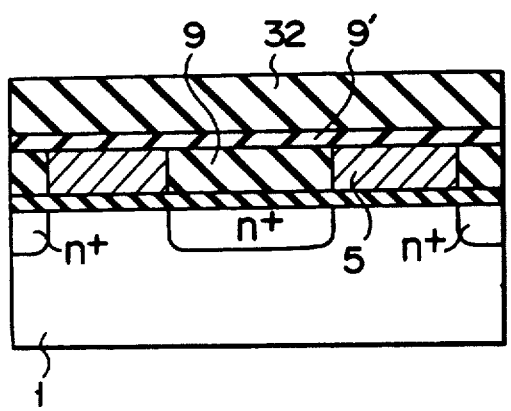
F I G. 6B
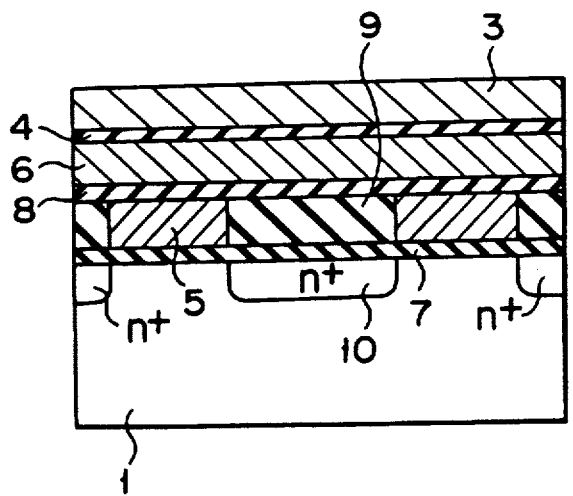
F I G. 6E
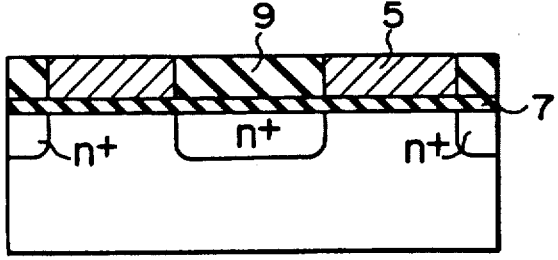
F I G. 6C
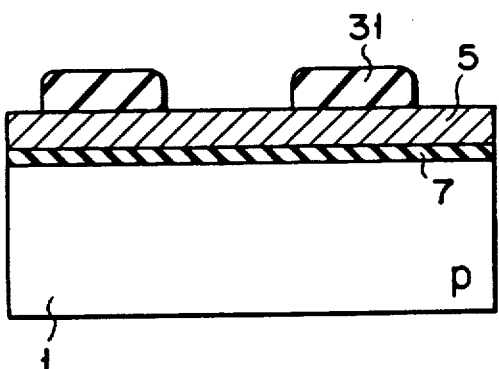
F I G. 6F

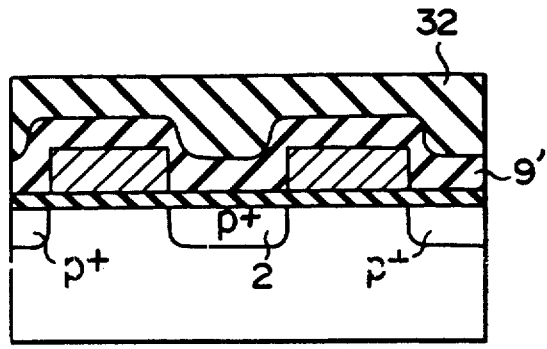
F I G. 6G
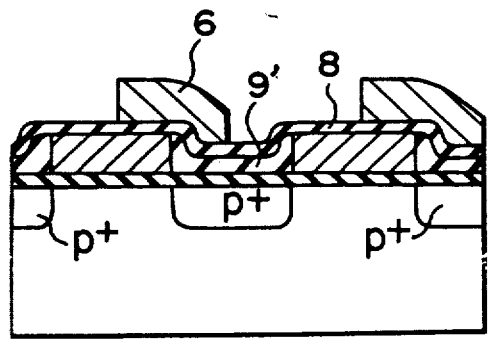
F I G. 6I
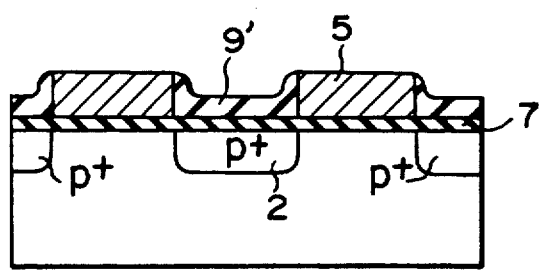
F I G. 6H
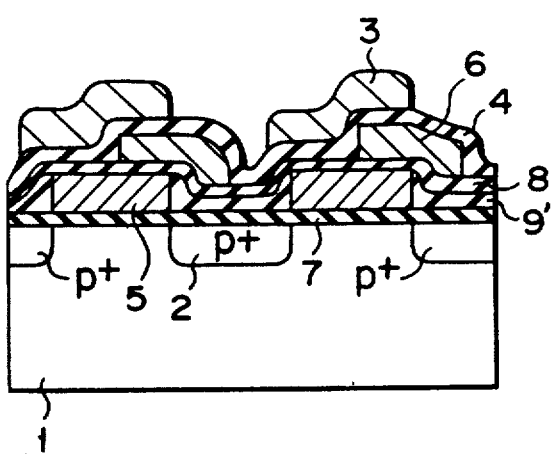
F I G. 6J

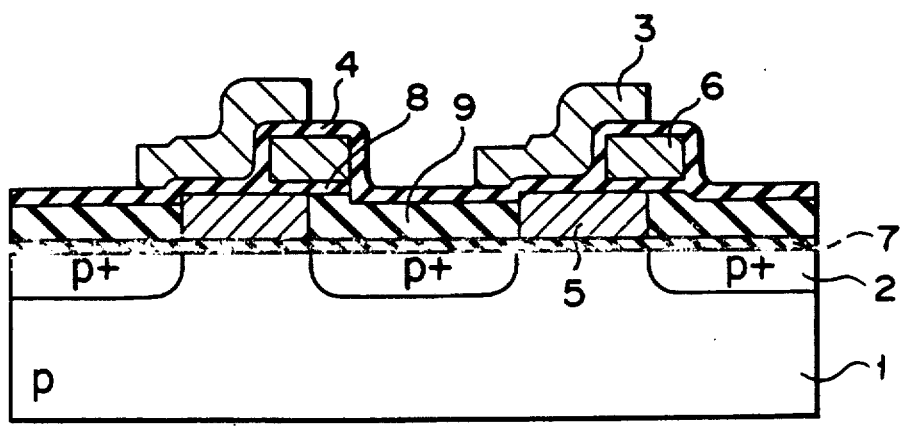
F I G. 11
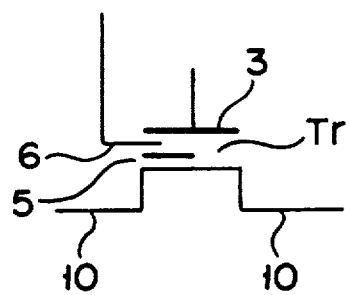
F I G. 12

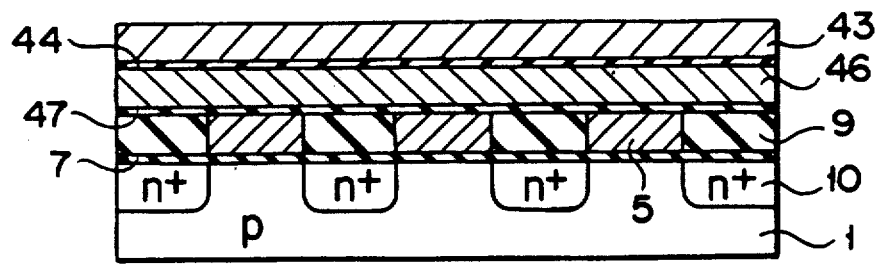
F I G. 16
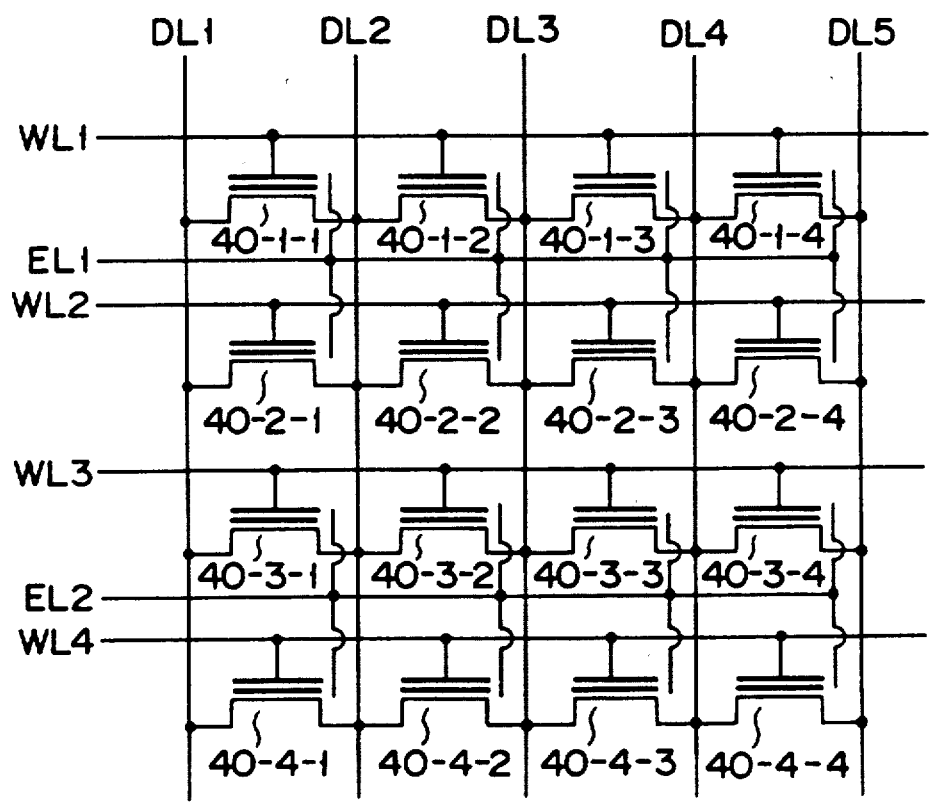
F I G. 17

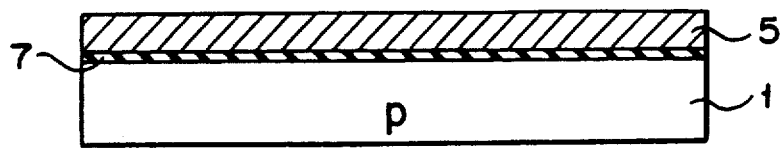
F I G. 18A
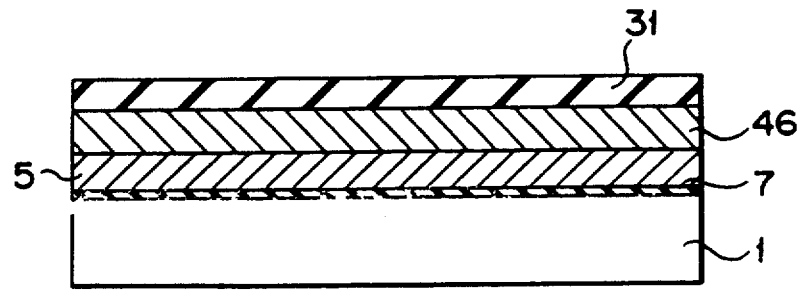
F I G. 18B
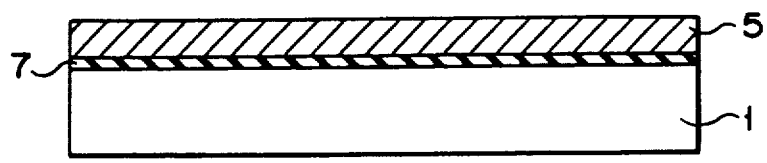
F I G. 18C
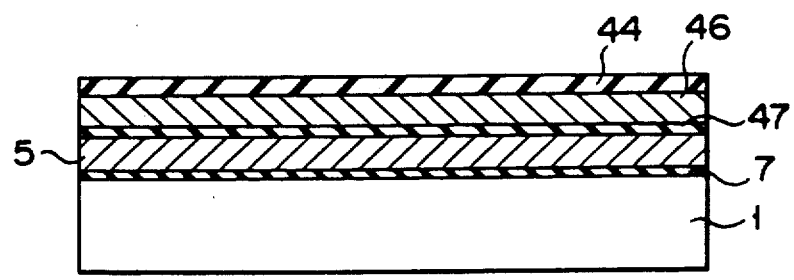
F I G. 18D
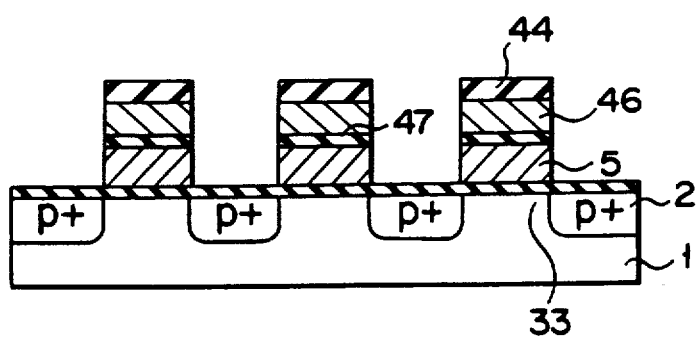
F I G. 18E
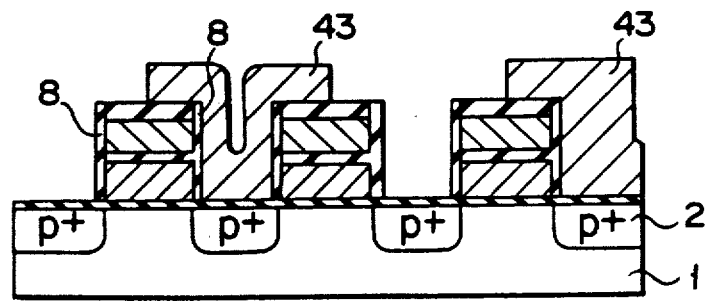
F I G. 18F

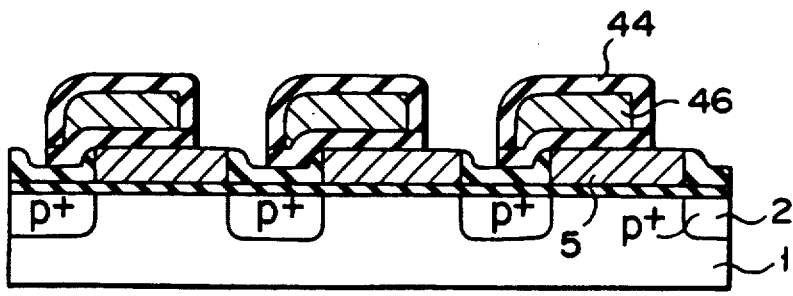
F I G. 19J
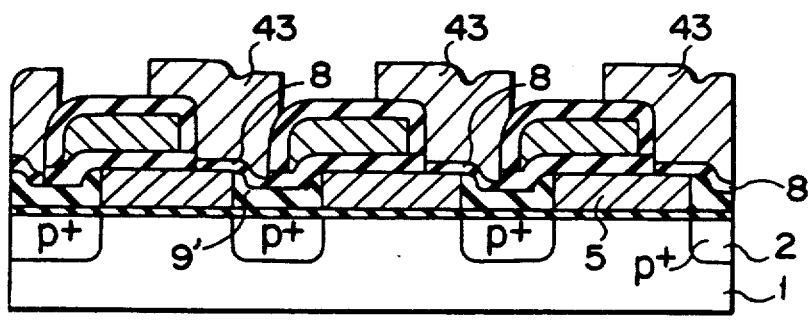
F I G. 19K
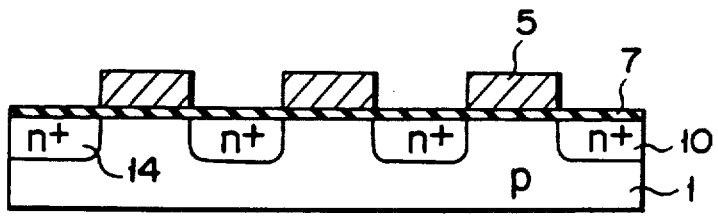
F I G. 19L
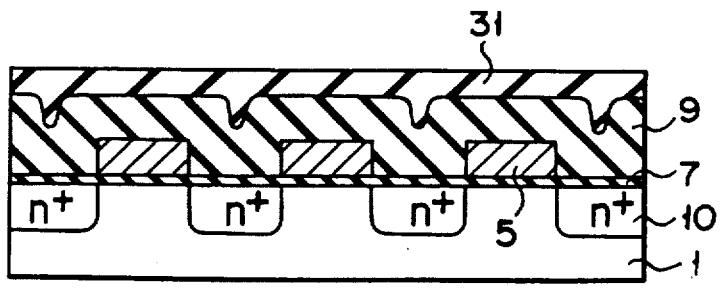
F I G. 19M

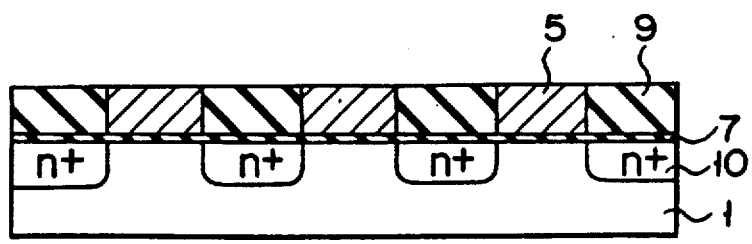
F I G. 19N
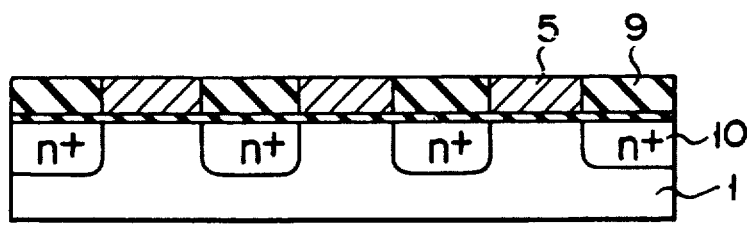
F I G. 19O
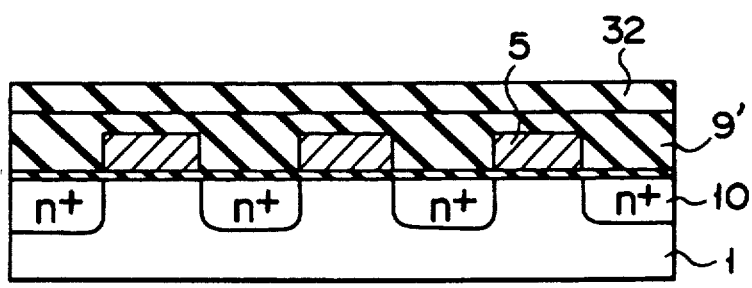
F I G. 19P
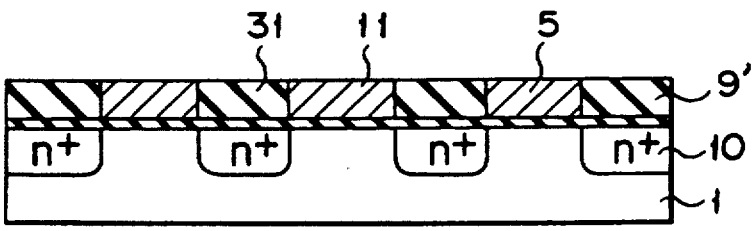
F I G. 19Q
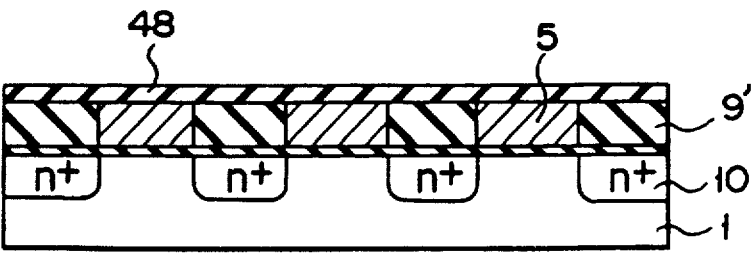
F I G. 19R

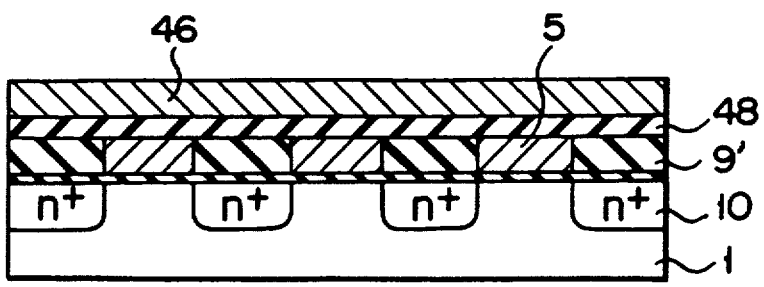
F I G. 19S
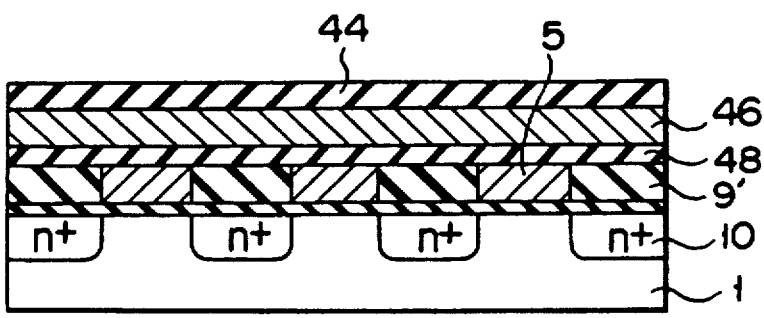
F I G. 19T
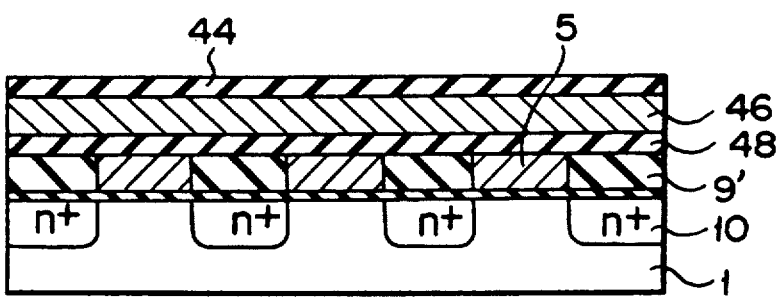
F I G. 19U
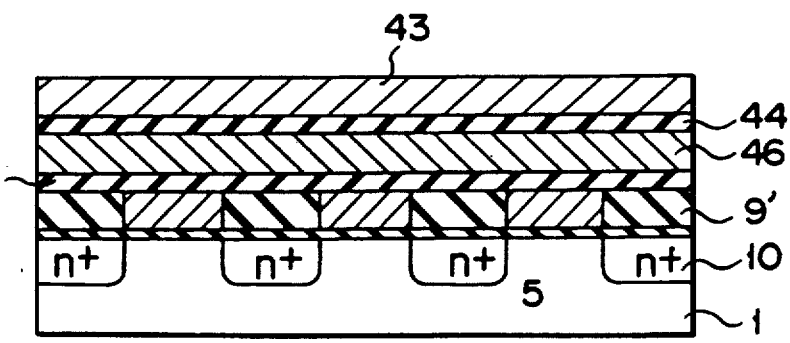
F I G. 19V

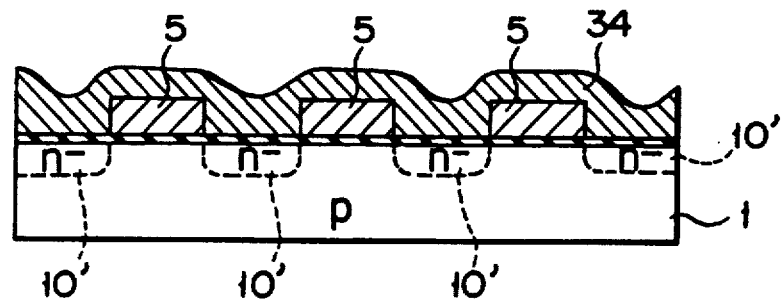
F I G. 23A
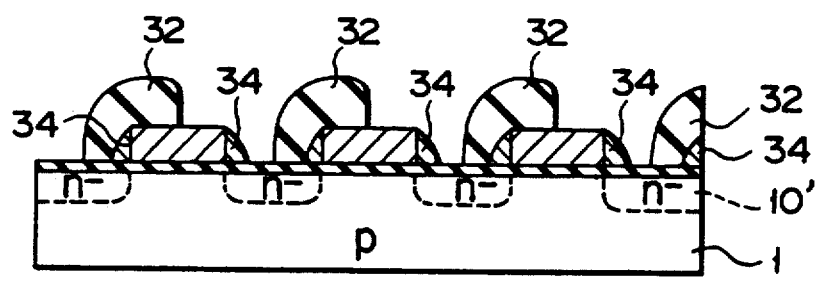
F I G. 23B
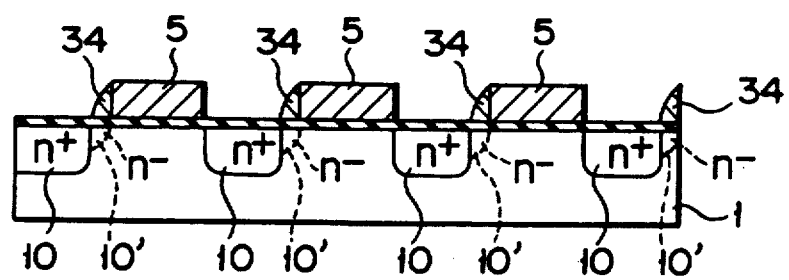
F I G. 23C

NONVOLATILE SEMICONDUCTOR MEMORY

BACKGROUND OF THE INVENTION

1. Field of the Invention

The present invention relates to a nonvolatile semiconductor memory and a method of manufacturing the same obtained by improving structures of a cell transistor and a cell array and their formation methods in an electrically erasable programmable read-only memory (EEPROM) including a gate electrode having a three-layered structure.

2. Description of the Related Art

A large-capacity ultraviolet erasable programmable read-only memory (EPROM) has been developed as one of nonvolatile semiconductor memories to which data can be electrically written. In particular, as a technique to achieve high integration, a method of forming an EPROM cell by performing element isolation without using local oxidation is disclosed in U.S. Pat. No. 4,597,060.

A planar pattern of this EPROM cell is shown in FIG. 1A. FIG. 1B shows a sectional structure taken along the line of B—B in a row line (word line) direction, and FIG. 1C shows a sectional structure taken along the line of C—C in a column line (data line) direction. This EPROM is formed as follows. A first gate insulating film 171 is formed on the surface of a semiconductor substrate 170. A first polysilicon film 172 is deposited on the first gate insulating film, and is etched into stripes each having a predetermined width along a column direction of a cell array. Using the first polysilicon film 172 patterned into a striped shape in the column direction as a mask, an impurity diffusion region 173 of a conductivity type opposite to that of the substrate is formed in the semiconductor substrate to form source and drain regions of a cell transistor. A first insulating film 174 having a thickness substantially equal to that of the first polysilicon film 172 is buried between the patterned stripes of the first polysilicon film on the substrate. Thereafter, a second gate insulating film 175 is formed on the semiconductor substrate, and a second polysilicon film 176 is deposited on the second gate insulating film 175. The second polysilicon film 176, the second gate insulating film 175, and the first polysilicon film 172 are etched into stripes each having a predetermined width along a row direction of the cell array to form control and floating gate electrodes 176 and 172. Using the control gate electrode 176 pattered into a striped shape in the row direction as a mask, impurity ions of the same conductivity type as that of the substrate are implanted in an exposed surface of the semiconductor substrate. Therefore, an element isolation region 177 is formed to define an element region in the column direction.

In this case, since the first insulating film 174 having a large thickness is formed on the impurity diffusion regions 173 serving as the source and drain regions of the cell transistor, the ions are not implanted in the source and drain regions.

According to the above method of forming the EPROM cell, ions are implanted using the second polysilicon film (control gate electrode) 176 as a mask to form the element isolation region 177. Therefore, the element isolation region 177 does not have a fringe such as a bird beak formed by local oxidation. In addition, since the floating gate electrode 172 is formed in self-alignment when the control gate electrode 176 is formed, a margin for mask alignment is not required, thus preventing misalignment. Since the source and drain regions of the cells adjacent to each other in the row direction can be shared, excellently micropatterned cells can be formed.

In the above-mentioned EPROM cell having a two-layered gate electrode structure disclosed in U.S. Pat. No. 4,597,060, data cannot be electrically erased. An EPROM integrated circuit using this EPROM cell is undesirably expensive because a window through which ultraviolet rays are emitted must be formed in a package. After this EPROM integrated circuit is mounted on a printed circuit board, it is difficult to update data.

On the other hand, the conventional electrically erasable EEPROM cells can be clarified into the following two cells: a cell having a two-layered gate electrode structure consisting of control and floating gate electrodes; and a cell having a three-layered gate electrode structure, consisting of the above electrodes and an erase gate electrode, disclosed in U.S. Pat. No. 4,466,081. In the former EEPROM cell, during an erase operation, a high voltage is applied to a drain or a source of the cell transistor to utilize a tunnel current in a gate oxide film. Only a voltage which is equal to or lower than a breakdown voltage of a drain or source junction can be applied as the high voltage. In order to increase an erase efficiency, the thickness of the first gate oxide film between the floating gate electrode and the drain or the source must be decreased. With this decrease, the ratio of a capacitance between the floating gate electrode and the drain or the source, and a capacitance between the floating gate electrode and the semiconductor substrate is increased, and the ratio of capacitances between the control and floating gate electrodes, which affects writing characteristics, is decreased.

In contrast to this, in the latter EEPROM cell disclosed in U.S. Pat. No. 4,466,081, a high voltage is applied to the erase gate electrode during an erase operation, and the thickness of the first gate oxide film need not be decreased. Therefore, sufficient writing characteristics which are equal to those of the EPROM cell can be obtained without a decrease in ratio of capacitances between the control and floating gate electrodes, which affects writing characteristics.

In the conventional EEPROM disclosed in U.S. Pat. No. 4,466,081, a field oxide film is selectively formed by thermal oxidation using local oxidation (LOCOS) in order to isolate the cells adjacent to each other (element isolation). This local oxidation has an advantage in that an oxide film having a large thickness in a longitudinal direction with respect to the surface of the semiconductor substrate can be easily formed. However, at the same time, an oxide film is undesirably formed into a bird-beak shape along a lateral direction. Therefore, the element isolation region is undesirably spread, resulting in an increase in cell area. A contact area is also undesirably increased. In this structure, since the erase and control gate electrodes are perpendicular to each other, an unnecessary portion is undesirably formed when blocks are formed along the erase gate electrode.

SUMMARY OF THE INVENTION

It is an object of the present invention to provide an electrically erasable nonvolatile semiconductor memory which includes a gate electrode having a three-layered structure, has high integration, and is obtained by eliminating drawbacks of conventional ROMs such as an EPROM array having a two-layered structure, in which data cannot be electrically erased although element isolation is performed without a field oxide film, or an electrically erasable EEPROM having a three-layered structure, in which, although sufficient writing characteristics can be obtained, it is difficult to achieve high integration because element isolation is performed by a field oxide film, as described above, and a method of manufacturing the nonvolatile semiconductor memory.

In order to achieve the above object, according to the present invention, there is provided a nonvolatile semiconductor memory including a cell array in which cell transistors, each having source and drain regions element-isolated by an element isolation region without a bird beak, are formed in a semiconductor substrate and arranged in a matrix form, wherein the cell transistor includes a gate electrode having a three-layered structure on the semiconductor substrate and formed such that a third-layer gate electrode opposes first- and second-layer gate electrodes through a gate insulating film, the first-layer gate electrode serves as a floating gate electrode, the second- or third-layer gate electrode serves as an erase or control gate electrode, the erase and control gate electrodes are parallel to each other running in a row direction and are perpendicular to the source and drain regions arranged in a column direction array, and the common source and drain regions of the cell transistors adjacent to each other along a channel length direction of the channel region are formed.

A method of manufacturing the nonvolatile semiconductor memory according to the present invention, comprises the steps of:

forming a first gate insulating film on a surface of a semiconductor substrate;

depositing a first polysilicon film on the first gate insulating film, and patterning the first polysilicon film into stripes each having a predetermined width along a column direction of a cell array;

forming impurity diffusion regions of a conductivity type opposite to that of the substrate in the semiconductor substrate using the first polysilicon film patterned into a striped shape along the column direction as a mask to form source and drain regions of a cell transistor;

burying a first insulating film having a thickness substantially equal to that of the first polysilicon film between the patterned stripes of the first polysilicon film on the substrate;

forming a tunnel insulating film on the semiconductor substrate after the step of burying the first insulating film;

depositing a second polysilicon film on the tunnel insulating film, and patterning the second polysilicon film, the tunnel insulating film, and the first polysilicon film into stripes each having a predetermined width along a row direction of the cell array to form a floating electrode;

forming an element isolation region in the semiconductor substrate using the first insulating film and the second polysilicon film patterned into a striped shape along the row direction as a mask;

etching the second polysilicon film patterned into a striped shape along the row direction to have a width smaller than that of the floating gate electrode consisting of the first polysilicon film arranged below the second polysilicon film, thus forming an erase gate electrode;

forming a second gate insulating film having a high breakdown voltage on the semiconductor substrate after the step of forming the erase gate electrode; and depositing a third polysilicon film on the second gate insulating film, and patterning the third polysilicon film into stripes to oppose the floating and erase gate electrodes along the row direction of the cell array, thus forming a control gate electrode.

According to the above-described nonvolatile semiconductor memory and the method of manufacturing the same of the present invention, since a field oxide film is not used, source and drain regions of cell transistors adjacent to each other are shared, and the erase and control gate electrodes are arranged to be parallel to each other in the gate electrodes with the three-layered structure, excellently micropatterned cells can be formed, high integration can be achieved, and a nonvolatile semiconductor memory having electrically erasable EEPROM cells, and a method of manufacturing the same can be obtained.

BRIEF DESCRIPTION OF THE DRAWINGS

FIG. 5 is a circuit diagram showing a cell array shown in FIG. 2A and some of its peripheral circuits;

FIGS. 6A to 6J are sectional views, taken along the row and column directions, which show the steps in manufacturing the nonvolatile semiconductor memory of the present invention according to a second manufacturing method;

FIG. 11 is a sectional view taken along the line of D—D of FIG. 8;

FIG. 12 is a circuit diagram showing an equivalent circuit of the cell transistor shown in FIGS. 8 to 11;

FIG. 16 is a sectional view taken along the line of C—C of FIG. 14;

FIG. 17 is a circuit diagram showing a part of the cell array shown in FIGS. 14 to 16;

FIGS. 18A to 18L are sectional views which show the steps in manufacturing the nonvolatile semiconductor memory of the present invention according to a fourth manufacturing method, and the steps in manufacturing the cell transistor shown in FIGS. 14 to 16;

FIGS. 23A to 23C are sectional views showing a second method of manufacturing the cell transistor shown in FIG. 21.

DETAILED DESCRIPTION OF THE PREFERRED EMBODIMENTS

Embodiments of the present invention will be described hereinafter in detail with reference to the accompanying drawings.

Figure 1A:
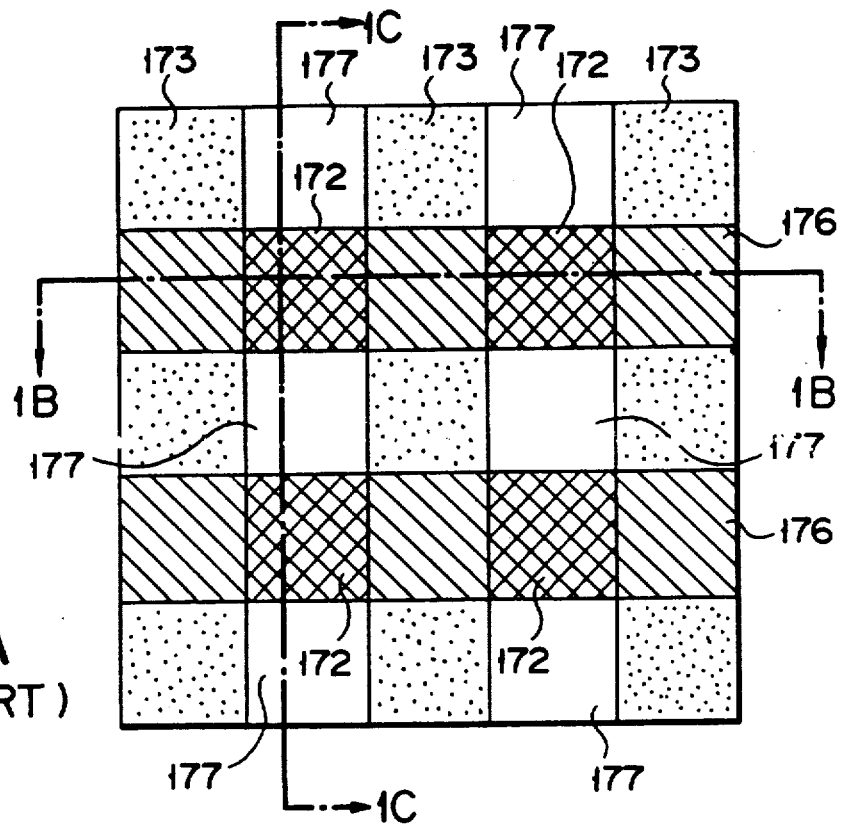
FIG. 1A is a view showing a planar pattern of a conventional EPROM cell.
Figure 1B:
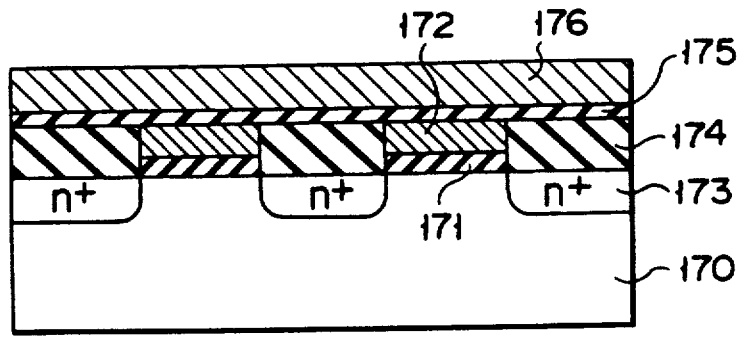
FIG. 1B is a sectional view taken along the line of B—B of FIG. 1A.
Figure 1C:
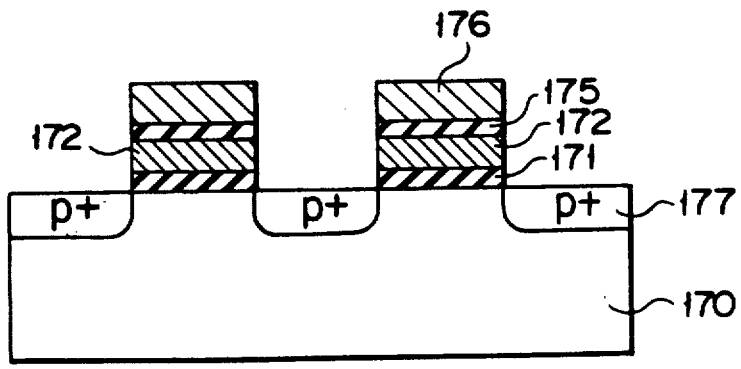
FIG. 1C is a sectional view taken along the line of C—C of FIG. 1A.
Figure 2A:
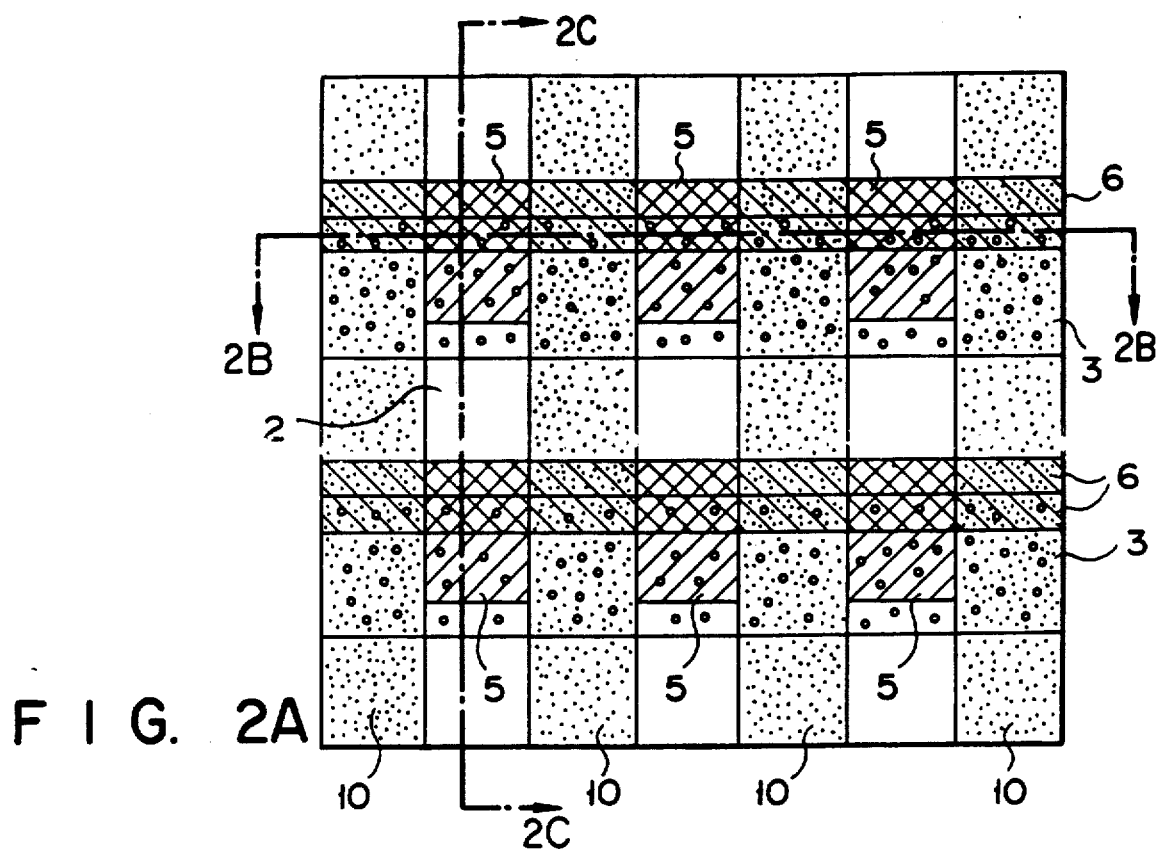
FIG. 2A is a view showing a planar pattern of a part of a cell array of a nonvolatile semiconductor memory according to an embodiment of the present invention.
Figure 2B:
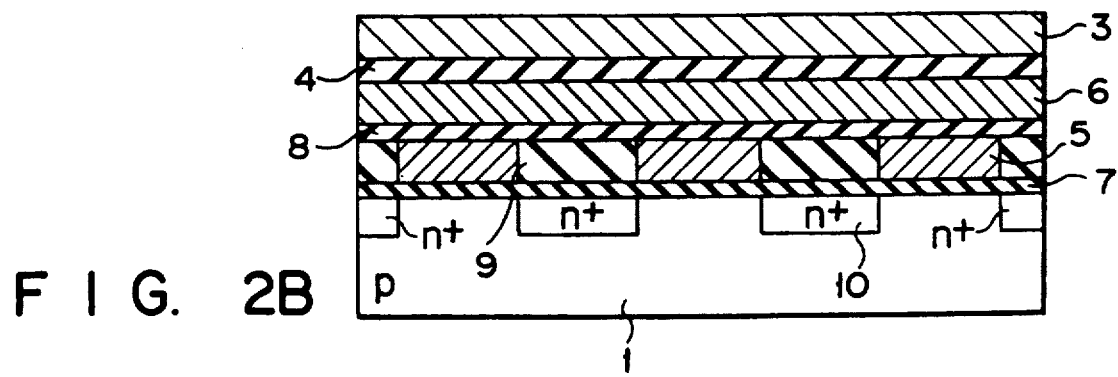
FIG. 2B is a sectional view taken along the line of B—B of FIG. 2A.
Figure 2C:
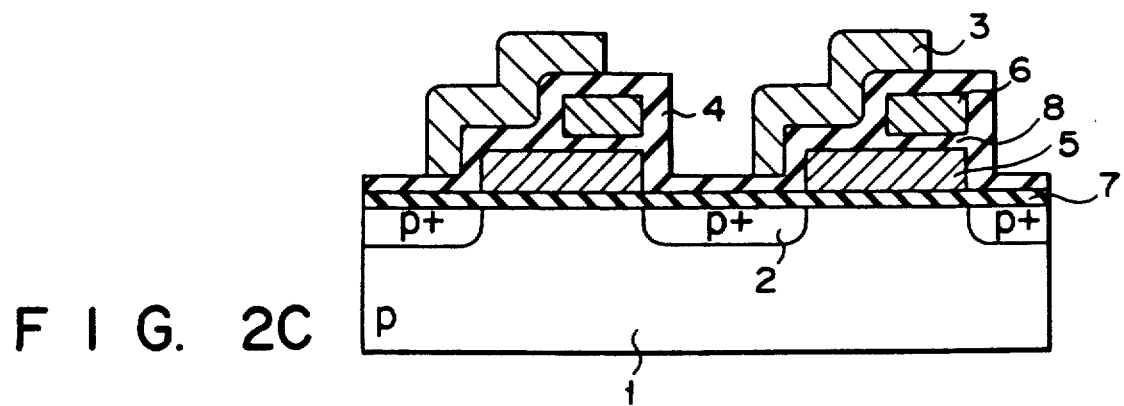
FIG. 2C is a sectional view taken along the line of C—C of FIG. 2A.

FIG. 2A shows a planar pattern of a part of a cell array in a semiconductor integrated circuit, e.g., an EEPROM integrated circuit, having an array of EEPROM cells. FIG. 2B is a sectional view taken along the line of B—B in a row line (word line) direction, and FIG. 2C is a sectional view taken along the line of C—C in a column line (data line) direction.

More specifically, this EEPROM integrated circuit includes a cell array in which cell transistors, each having source and drain regions which are element-isolated by an element isolation region 2 without a bird beak formed in a semiconductor substrate 1 and arranged in a matrix form. The cell transistor includes a gate electrode having a three-layered structure on the semiconductor substrate 1. In this three-layered gate electrode, a third-layer gate electrode 3 is arranged to oppose first- and second-layer gate electrodes 5 and 6 through a gate insulating film 4 having a high breakdown voltage. The first-layer gate electrode serves as a floating gate electrode 5, and the second-layer gate electrode serves as an erase gate electrode 6. The erase gate electrode 6 is formed to shift in, e.g., a widthwise direction with respect to the floating gate electrode 5 and to partially oppose the electrode 5. The third-layer gate electrode serves as a control gate electrode 3.

For example, the gate insulating film 4 having a high breakdown voltage consists of a composite film obtained by stacking two or more oxide and nitride films, or of only an oxide film. Reference numeral 7 denotes a gate insulating film between the semiconductor substrate surface and the floating gate electrode 5; 8, a tunnel insulating film between the floating and erase gate electrodes 5 and 6; 9, an insulating film buried in the semiconductor substrate on the source and drain regions, e.g., a CVD oxide film formed by CVD (chemical vapor deposition). As shown in FIG. 2A, when the planar pattern of the transistor array is viewed, the erase gate electrode 6 and control gate electrode 3 are arranged parallel to each other and run in the row line direction. The erase gate electrode 6 and the control gate electrode 3 are perpendicular to a column array of source and drain regions across the channel region. Further, the transistors are arranged adjacent to each other in the row line direction through the channel region such that the source region of one of the adjacent transistors is shared by the drain region of the other transistor to provide a common source/drain region 10.

In the above cell array, the common source and drain regions of the cell transistors adjacent to each other in a single row are formed, and the common source/drain regions 10 are formed in the column direction to be common to column memory cells, thus serving as column lines (data lines). The common row erase gate electrodes 6 in the memory cells are formed along the row direction to form erase lines. In addition, the common row control gate electrodes 3 of the memory cells are formed along the row direction so as to be parallel to the erase lines, thus forming word lines (control gate lines).

A method of manufacturing the cell transistor shown in FIGS. 2A to 2C without employing LOCOS will be described below with reference to FIGS. 3A to 3J showing a sectional structure along the word line direction, and FIGS. 3K to 3T showing a sectional structure along the column line direction.

Figure 3A:
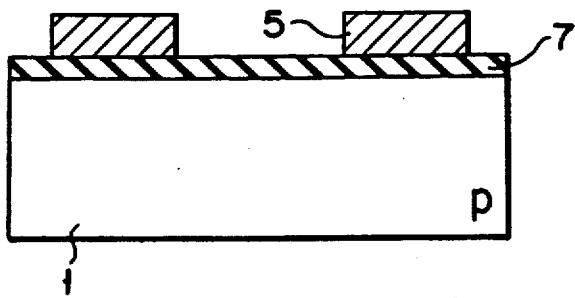
FIGS. 3A to 3T are sectional views, taken along the row and column directions, which show the steps in manufacturing the nonvolatile semiconductor memory of the present invention according to a first manufacturing method.
Figure 3B:
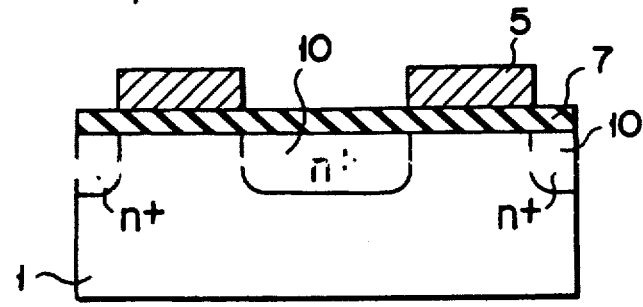
Figure 3C:
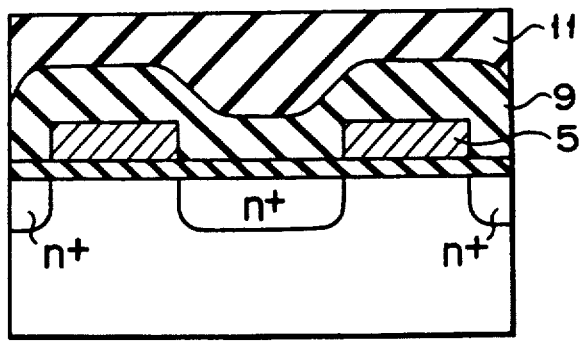
Figure 3D:
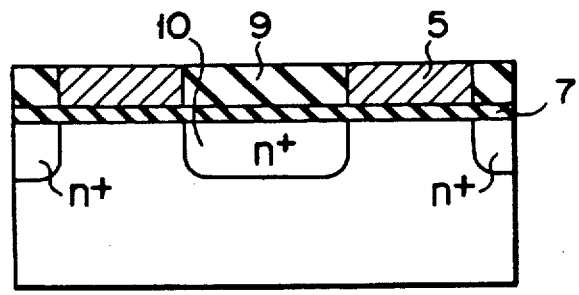
Figure 3E:
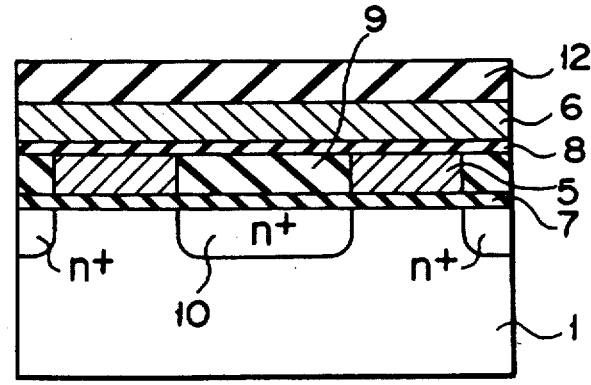
Figure 3F:
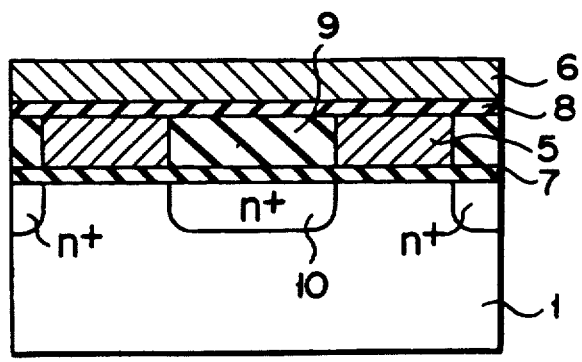
Figure 3G:
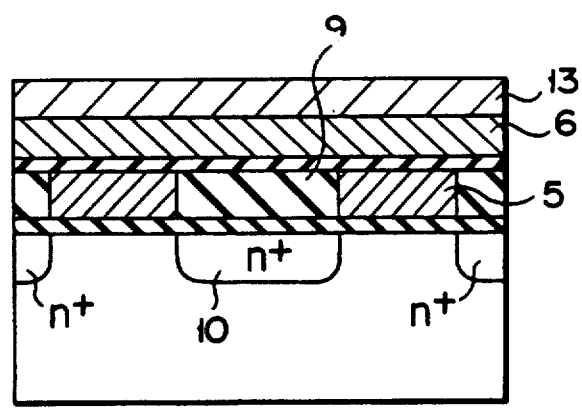
Figure 3H:
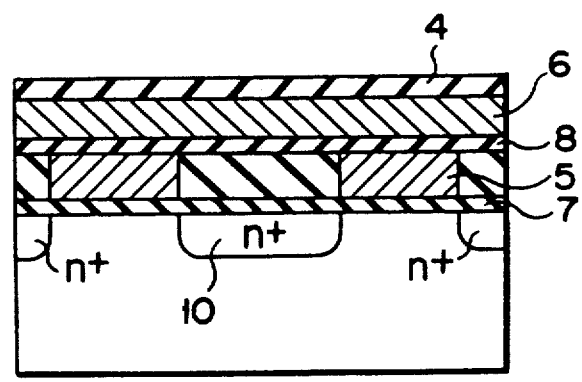
Figure 3I:
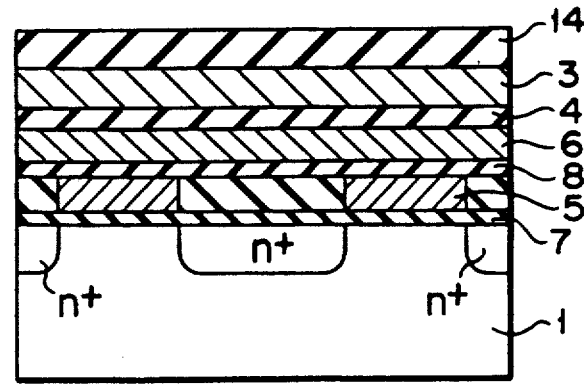
Figure 3J:
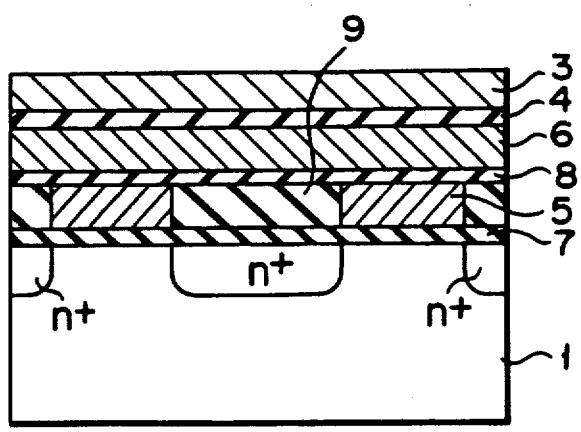
Figure 3K:
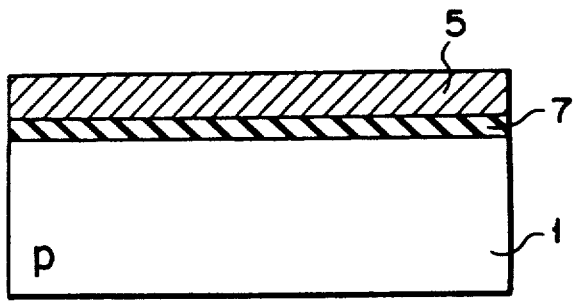

As shown in FIGS. 3A and 3K, ions are implanted in an entire surface of, e.g., the p-type semiconductor substrate 1 in order to control the threshold value of the cell transistor. Thereafter, the first gate insulating film (e.g., the thermal oxide film) 7 having a thickness of about 300 Å is formed, and the first polysilicon film 5 is deposited on the first gate insulating film 7. The first polysilicon film 5 is patterned into stripes each having a predetermined width along a column direction of the cell array to determine the length of the floating gate electrode. Note that, in this step, the first gate insulating film 7 may be etched or left without being etched (this also applies to other embodiments to be described later).

Figure 3L:
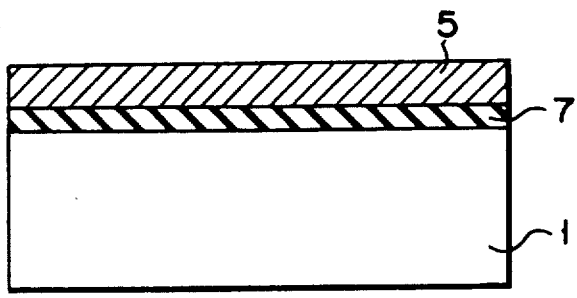

As shown in FIGS. 3B and 3L, using the first polysilicon film 5 patterned into a striped shape along the column direction as a mask, a high-concentration n+-type impurity diffusion region of a conductivity type opposite to that of the substrate is formed in the semiconductor substrate to form the source/drain region 10 of the cell transistor.

Figure 3M:
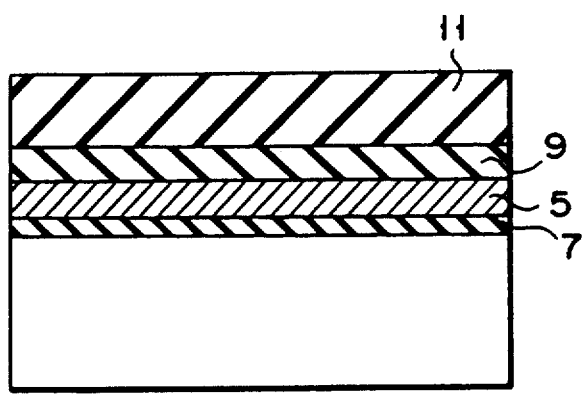
Figure 3N:
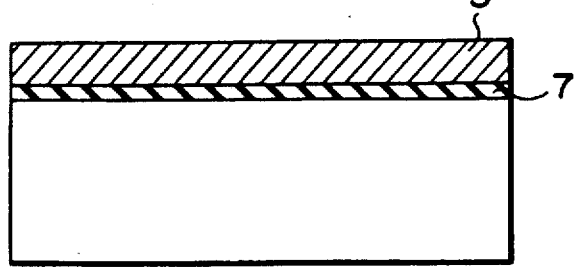

As shown in FIGS. 3C and 3M, the first insulating film 9 having a thickness substantially equal to that of the first polysilicon film 5 is buried between the patterned stripes of the first polysilicon film (on the substrate of the n+-type region 10) on the substrate. In this case, after an oxide film having a small thickness is formed on the first polysilicon film 5, the CVD oxide film 9 having a thickness larger than that of the first polysilicon film 5 is formed. Then, a resist 11 is applied on the CVD oxide film having a large thickness so as to flatten the surface. The etching ratio of the resist 11 and the CVD oxide film 9 is 1:1. By simultaneously etching the resist 11 and the CVD oxide film 9 up to an upper surface of the first polysilicon film 5, the CVD oxide film 9 having a thickness substantially equal to that of the first polysilicon film 5 can be buried on the n$^+$-type region 10 on the substrate, as shown in FIGS. 3D and 3N.

Figure 3O:
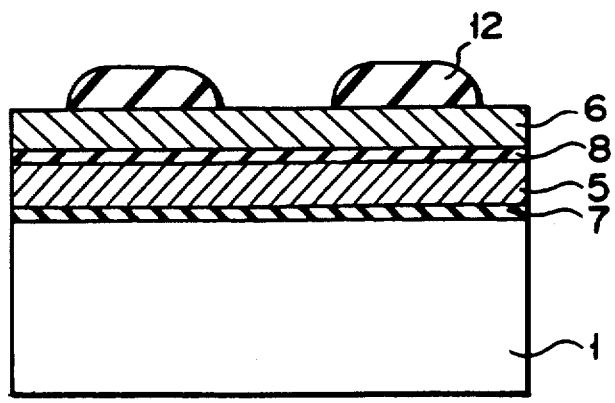
Figure 3P:
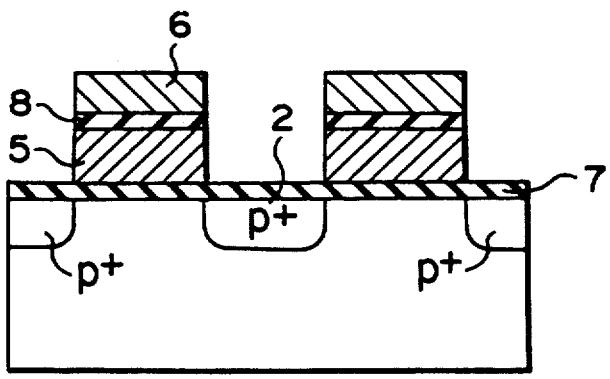

As shown in FIGS. 3E and 3O, the second gate insulating film (e.g., the oxide film) 8 serving as a tunnel insulating film is formed on the semiconductor substrate to have a thickness of about 300 Å. In addition, the second polysilicon film 6 is deposited on the second gate insulating film, and a resist 12 is patterned on the second polysilicon film 6. As shown in FIGS. 3F and 3P, using the resist 12 as a mask, the second polysilicon film 6, the second gate insulating film 8, and the first polysilicon film 5 are patterned into stripes each having a predetermined width along the row direction (the direction perpendicular to the column direction) of the cell array to determine the width of the floating gate electrode. At this time, the buried CVD oxide film 9 is left without being etched.

In this state, impurity ions (e.g., boron B$^+$) of the same conductivity type as that of the substrate are implanted in the semiconductor substrate using the first insulating film and the second polysilicon film 6 patterned into a striped shape along the row direction as a mask, and the p$^+$-type element isolation region 2 having no bird beak is formed to define the element region in the column direction. At this time, since the n$^+$-type region 10 is protected by the thick CVD oxide film 9 formed above the region 10, the region 10 can be free from an adverse effect of the ion implantation.

Figure 3Q:
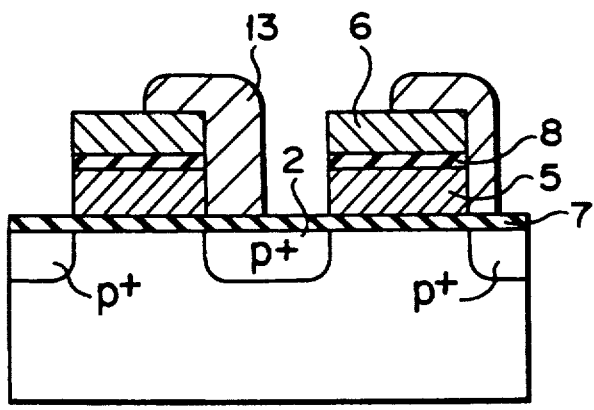

In this state, the second polysilicon film 6 entirely covers the floating gate electrode 5. In order to increase a coupling capacitance ratio Ccf/Ct of the control and floating gate electrodes 3 and 5 which are to be formed in the succeeding step, using a resist 13 formed as shown in FIGS. 3G and 3Q as a mask, one side portion of the second polysilicon film 6 patterned into a striped shape along the row direction is etched to have a width smaller than that of the floating gate electrode 5 formed below the film 6, thereby forming the erase gate electrode 6 which opposes a part of the floating gate electrode 5 through the second gate insulating film 8.

Figure 3R:
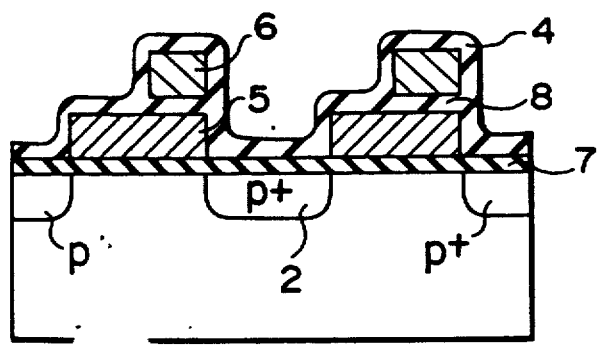

As shown in FIGS. 3H and 3R, the third gate insulating film 4 is formed above the semiconductor substrate. When the third gate insulating film 4 has a three-layered structure (e.g., oxide film/nitride film/oxide film), a high breakdown voltage can be obtained. In addition, when the film 4 has a permittivity higher than that of the oxide film, a coupling capacitance Ccf of the control and floating gate electrodes 3 and 5 can be increased.

Figure 3S:
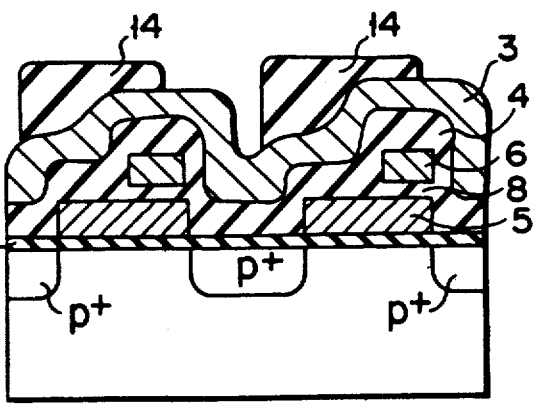
Figure 3T:
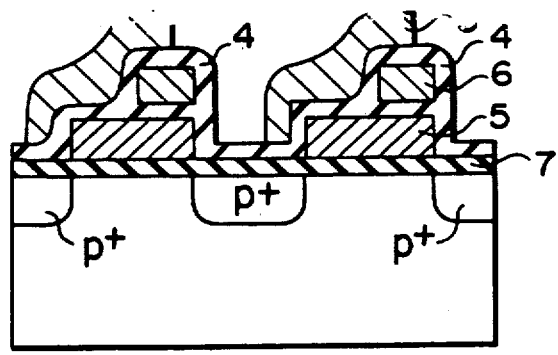

As shown in FIGS. 3I and 3S, the third polysilicon film 3 is deposited on the third gate insulating film 4. Using a resist 14 formed on the film 3 as a mask, the third polysilicon film 3 is etched into stripes each having a predetermined width to oppose the floating and erase gate electrodes 5 and 6 along the row direction of the cell array, thus forming the control gate electrode 3, as shown in FIGS. 3J and 3T. In this case, when the control gate electrode 3 is formed to entirely cover portions from an upper edge portion of one side of the floating gate electrode 5 to a part of the side surface, the capacitance Ccf/Ct can be effectively increased, i.e., 0.5 or more.

The above-mentioned cell transistor shown in FIGS. 2A to 2C includes a gate electrode having a three-layered structure including the erase gate electrode 6 on the semiconductor substrate. Therefore, data in this transistor can be electrically erased. In addition, since the control gate electrode 3 opposes the floating and erase gate electrodes through the gate insulating film 4 having a high breakdown voltage, a highly reliable EEPROM cell can be realized.

The above-mentioned cell transistor is element-isolated by the element isolation region 2 having no bird beak, and a fringe portion of the gate is not formed. The cell area is small, i.e., is substantially equal to that of the conventional EPROM, thus achieving high integration.

In the above-mentioned cell transistor, since the common source and drain regions of the cell transistors adjacent to each other in the channel length direction of the channel region are formed, the number of contact portions of the source and drain regions and upper wiring layers can be decreased, thus further achieving high integration.

Note that the tunnel insulating film 8 between the floating and erase gate electrodes 5 and 6 must be highly reliable because a high-intensity electric field is applied thereto in an erase mode. In the above-mentioned method shown in FIGS. 3A to 3T, however, the second polysilicon film 6 is formed on the tunnel insulating film 8 immediately after the tunnel insulating film 8 is grown on the first polysilicon film 5. Therefore, there is no step such as double or overlap oxidation which causes degration of the quality of films, and hence the high-quality and high-reliability tunnel insulating film 8 can be formed.

In the above-mentioned method, however, each of the n$^+$- and p$^+$-type regions 10 and 2 is formed using the polysilicon layer serving as the gate as a mask. Therefore, a margin for mask alignment need not be taken into consideration. From this point, a decrease in cell area and high integration can be achieved.

In the above-mentioned EEPROM cell, a high voltage is applied to the erase gate electrode 6 upon an erase operation. However, the thickness of the first gate oxide film 7 need not be decreased, so that sufficient writing characteristics equal to those of the EPROM cell can be obtained without decreasing a capacitance between the control and floating gate electrodes 3 and 5 which affects the writing characteristics.

In an EEPROM integrated circuit using the above-mentioned EEPROM cells, a window through which ultraviolet rays are emitted need not be formed in a package, and the circuit can be sealed into a plastic package. Therefore, cost can be decreased, and data can be updated on a printed circuit board when this circuit is mounted on the printed board and is applied to a system product, thus realizing an easy operation.

Figure 4A:
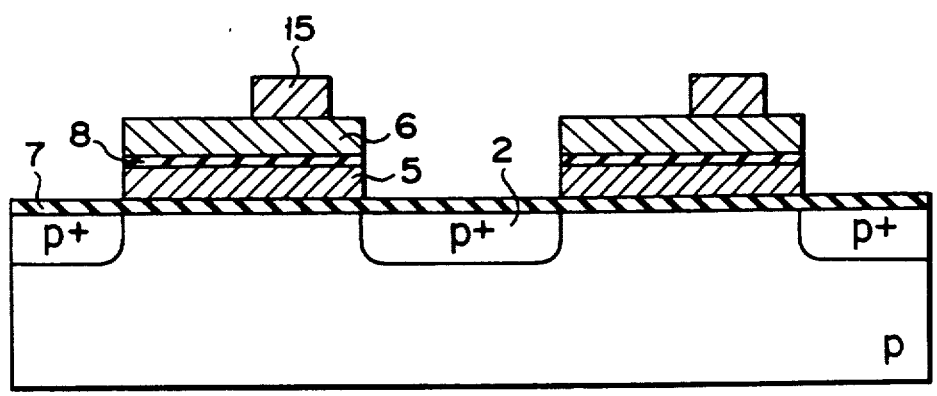
FIGS. 4A and 4B are sectional views showing the manufacturing steps obtained by partially modifying the sectional views showing the manufacturing steps in FIGS. 3A to 3T.
Figure 4:
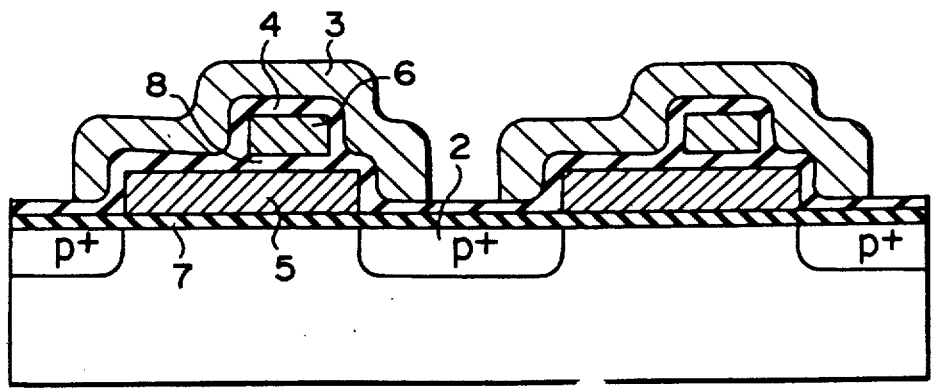

In the above-mentioned method shown in FIGS. 3A to 3T, when the second polysilicon film 6 is etched to have a width smaller than that of the floating gate electrode 5 formed below the film 6, both side portions of the second polysilicon film 6 may be etched to remain a central portion using a resist 15 formed as shown in FIG. 4A as a mask, in place of the steps shown in FIGS. 3G and 3Q. In this case, even if the position of the resist 15 is offset due to mask misalignment, the width of the second polysilicon film 6 can be reliably determined.

Thereafter, as shown in FIG. 4B, the control gate electrode 3 can be formed through the third gate insulating film 4.

FIG. 5 shows the above-mentioned cell array shown in FIGS. 2A to 2C, and some of its peripheral circuits. Reference numerals 21-1-1 to 21-3-4 denote cell transistors (memory cells); 22-1 to 22-3, word lines; 23-1 to 23-3, erase lines; 24-1 to 24-5, column lines; 25, a row decoder; 26, a CG (control gate line)/EG (erase gate line) switching circuit for driving word and erase lines in a selected row in response to a row selection output from the row decoder 25; and 27, a booster connected to the CG/EG switching circuit 26, for applying a boosted voltage to the CG (control gate line) in a write mode (to be described later), and applying a boosted voltage to the EG (erase gate line) in an erase mode (to be described later). Reference numeral 28 denotes a column decoder; 29, a column selection gate for selecting a column in response to a column selection output from the column decoder 28; and 30, a sense amplifier connected to one terminal of the column selection gate 29.

An operation of the arrangement shown in FIG. 5 will be described below, taking the memory cell 21-2-2 connected to one pair of the word line 22-2, the erase line 23-2, and the column line 24-2 as an example. During a write operation for the memory cell 21-2-2, the CG/EG switching circuit 26 selects the word line 22-2 and the erase line 23-2 in response to a row selection output from the row decoder 25. The selected word line 22-2 receives a boosted voltage of, e.g., 12 V, and the selected erase line 23-2 is set to be, e.g., 5 V (e.g., a power source voltage). The non-selected word and erase lines are set at a ground potential. In addition, the column line 24-2 connected to the drain of the memory cell 21-2-2 selected by the column decoder 28 and the column selection gate 29 is set to be, e.g., 8 V, the column line 24-3 connected to the source of the selected memory cell 21-2-2 is set at the ground potential, and the non-selected column line is set in a potential floating state.

Thus, when a write voltage is applied to the selected memory cell, hot electrons generated by an avalanche effect are injected into the floating gate of the selected memory cell, and a threshold voltage when viewed from the control gate electrode of the selected memory cell is increased. Note that the selected erase line 23-2 is set to be 5 V in order to improve a write efficiency and to relax an electric field between the floating and erase gate electrodes when the potential of the floating gate electrode in the non-selected memory cell connected to the selected word line is increased due to capacitance coupling of the floating and control gate electrodes, thus preventing a write error of the non-selected memory cell.

In the erase operation of the memory cells, depending on selection methods of the erase lines, all bits can be simultaneously erased, or the bits can be erased in units of word lines (block erase). For example, in a simultaneous erase operation, the CG/EG switching circuit 26 supplies a boosted voltage of, e.g., 20 V, to all the erase lines 23-1 to 23-3. All the word lines 22-1 to 22-3 are set to be 5 V or the ground potential, and all the column lines 24-1 to 24-5 are set at the ground potential. Therefore, in all the memory cells, a high-intensity electric field is applied between the floating and erase gate electrodes, and electrons in the floating gate electrode are discharged into the erase gate electrode, thus setting an erase state.

At this time, after the write operation, a floating gate potential VFG(I) = −2 V, and an erase gate potential VEG = 20 V. A control gate potential VCG, a drain potential Vd, and a substrate potential VSUB are set at the ground potential. A sum of a capacitance Ccf between the floating and control gate electrodes, a capacitance Cef between the floating and erase gate electrodes, a capacitance Csubf between the floating gate electrode and the semiconductor substrate, and a capacitance Cdf between the floating gate electrode and the drain is denoted by reference symbol Ct (=Ccf+Cef+Csubf+Cdf). If the following equations are given:

$$Cef/Ct = 0.4$$

$$Cef/Ct = 0.2$$

$$Csubf/Ct = 0.3$$

$$Cdf/Ct = 0.1$$

then the floating gate potential VFG = 3 V is given by the following equation (1). If the thickness of the insulating film between the floating and erase gate electrodes TOXFE = 300 Å, an electric field applied between the floating and erase gate electrodes is as follows:

$$(20 - 3) V/300 Å = 9 MV/cm \quad (1)$$

$$VFG = VFG(I) + (VCG \times Ccf/Ct)$$
$$+ (VEG \times Cef/Ct)$$
$$+ (VSUB \times Csubf/Ct)$$
$$+ (Vd \times Cdf/Ct)$$

Thus, an electric field having an intensity of 9 MV/cm is applied to the insulating film 8 between the floating and erase gate electrodes 5 and 6. Therefore, if the quality of the insulating film 8 is poor, dielectric breakdown may occur to cause degration of reliability, and hence the insulating film 8 having a high breakdown voltage must be used.

During an erase operation in units of word lines (block erase), if only the memory cells 21-1-1 to 21-1-4 in a single row are erased, the boosted voltage VEG of, e.g., 20 V, is applied from the CG/EG switching circuit 26 to only the erase line 23-1 selected by the row decoder 25, and the non-selected erase lines are set at the ground potential. At this time, all the word lines 22-1 to 22-3 and all the column lines 24-1 to 24-5 are set to be 5 V or the ground potential in the same manner as in the above-mentioned simultaneous erase operation. Therefore, a high-intensity electric field is applied between the floating and erase gate electrodes in only the memory cells in one word line, thus setting an erase state.

During a read operation of the memory cell, potentials VCG and VEG of the word and erase lines selected by the row decoder 25 are simultaneously set to be, e.g., 5 V, and the non-selected word and erase lines are set at the ground potential. In this case, the state wherein VCG = 5 v, or VEG = 0 V (ground potential) may be set. However, as described above, when VEG = 5 V, the floating gate potential is increased by about VEG×Cef/Ct = 1 V because of capacitance coupling of the floating and erase gate electrodes. Therefore, a cell current is increased, and a high-speed operation can be performed as compared with a case wherein VEG=0 V. In addition, the potential Vd of the column line connected to the drain of the memory cell selected by the column decoder 28 and the column selection gate 29 is set to be, e.g., 2 V. The column line connected to the source of the selected memory cell is set at the ground potential, and the non-selected column lines are set in a potential floating state.

Thus, when a read voltage is applied to the selected memory cell, the contents of data in the selected memory cell are read out on the column line, and are detected and amplified by the sense amplifier 30, thus being output.

In the cell array shown in FIG. 5, since the common source and drain regions of the cell transistors adjacent to each other in a single row are formed, the cell can be micropatterned in the row direction. In addition, the number of contact portions in upper wiring layers with respect to the source/drain region is decreased.

Since the common column source and drain regions are formed along the column direction in the memory cells, the number of contact portions in the upper wiring layer with respect to the source/drain region is further decreased.

The common row erase gate electrodes of the memory cells are formed in the row direction, and the common row control gate electrodes of the memory cells are formed in the row direction so as to be parallel to the erase gate electrodes. Therefore, the erase and control gate electrodes are selectively controlled by the common decoder, and an erase operation in units of word lines (block erase) can be performed. Therefore, a decoder exclusively used for an erase operation is not required.

Depending on selection methods of the erase lines, all the bits can be simultaneously erased, or bits can be erased in units of word lines (block erase). More specifically, when an erase voltage is selectively applied to the erase gate electrodes in each row, the block erase operation can be performed. When the erase gate electrodes in a plurality of rows are commonly connected, and an erase voltage is applied to the common erase gate electrode, or when an erase voltage is separately and simultaneously applied to the erase gate electrodes in the plurality of rows, the cell transistors in a plurality of or all the rows can be simultaneously subjected to an erase operation.

A method of manufacturing a transistor, in which the position of the erase gate electrode 6 is different from that in the cell transistor shown in FIGS. 2A to 2C, without employing LOCOS method will be described below with reference to FIGS. 6A to 6E showing a sectional structure take along the line B—B in the word line direction, and FIGS. 6F to 6J showing a sectional structure taken along the line of C—C in the column line direction.

After the steps shown in FIGS. 3A to 3C, and FIGS. 3K to 3M, as shown in FIGS. 6A and 6F, a resist 31 is patterned on the first polysilicon film 5. As shown in FIGS. 6B and 6G, using the resist 31 as a mask, the first polysilicon film 5 is patterned into stripes each having a predetermined width along a row direction of the cell array to determine the width of a floating gate electrode. At this time, the buried CVD oxide film 9 is left without being etched. In this state, using the first polysilicon film 5 patterned into a striped shape in the row direction as a mask, impurity ions (e.g., boron B+) of the same conductivity type as that of the substrate are implanted in the semiconductor substrate, and the p+-type element isolation region 2 without a fringe is formed to define element regions in the column direction.

As described above, the third oxide film (e.g., CVD film) 9' is deposited, and a resist 32 is applied. These films are etched, and the third insulating film (e.g., CVD film) 9' having a thickness slightly smaller than that of the first polysilicon film 5 is buried on the element isolation region 2 on the substrate, as shown in FIGS. 6C and 6H. The thickness of the third insulating film 9' is slightly smaller than that of the first polysilicon film 5 because the erase gate electrode 6 is formed to oppose parts from a part of the upper surface to a part of the side surface of the floating gate electrode 5, as will be described later.

As shown in FIGS. 6D and 6I, the second gate insulating film 8 serving as a tunnel insulating film is formed above the semiconductor substrate. In addition, the second polysilicon film 6 is deposited on the second gate insulating film 8, and the second polysilicon film 6 is etched into stripes each having a predetermined width to oppose parts from a part of the upper surface to a part of the side surface of the floating gate electrode 5 along the row direction of the cell array, thus forming the erase gate electrode 6.

As shown in FIGS. 6E and 6J, the third gate insulating film 4 is formed above the semiconductor substrate to have a three-layered structure (e.g., oxide film/nitride film/oxide film). The third polysilicon film 3 is deposited on the third gate insulating film, and is etched into stripes each having a predetermined width to oppose the floating and erase gate electrodes 5 and 6 in the row direction of the cell array, thus forming the control gate electrode 3.

According to the above-mentioned method shown in FIGS. 6A to 6E and FIGS. 6F to 6J, in the formed cell transistor shown in FIGS. 6E and 6J, since the erase gate electrode 6 is formed to entirely cover portions from a one-side upper end (edge portion) of the floating gate electrode 5 to a part of the side surface, an erase efficiency is increased by an effect of the edge portion in an erase mode.

The erase gate electrode 6 to which a high-intensity electric field of about 20 V is applied is located above the element isolation region 2. However, since the third insulating film 9' having a large thickness is buried on the element isolation region on the substrate, a breakdown voltage of this portion is high, thus improving reliability.

Figure 7:
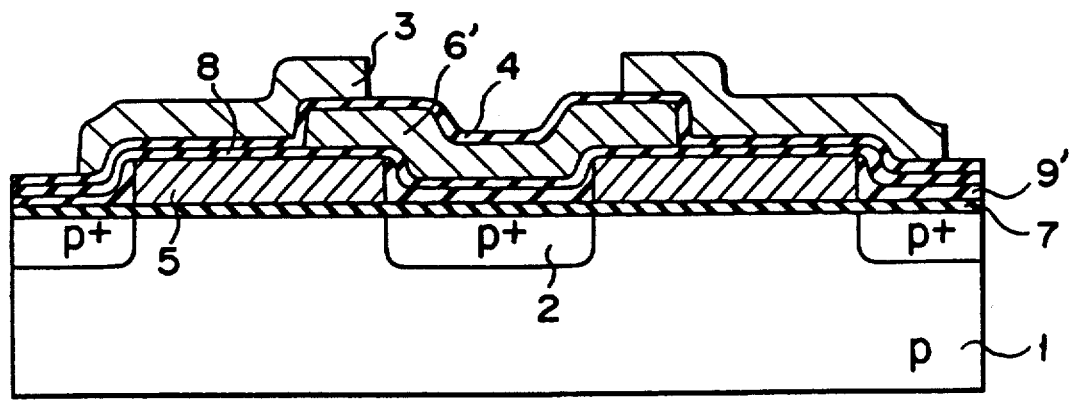
FIG. 7 is a sectional view showing a modification of a cell transistor shown in FIGS. 6E and 6J.

FIG. 7 shows a modification of the cell transistor shown in FIGS. 6E and 6J. An erase gate electrode 6' is formed to entirely cover the thick third insulating film 9' buried between the rows so as to be common to the cell transistors in two rows in each pair consisting of two rows. Therefore, a block erase operation in units of two word lines can be performed in the EEPROM of a type for performing a simultaneous erase operation.

When a plurality of pairs of the erase gate connected, or when an erase voltage is simultaneously applied to the plurality of pairs of the erase gate electrodes 6' in units of two word lines, a block erase operation with respect to two or more word lines can be realized.

When the erase gate electrodes 6' in all the pairs are commonly connected, a simultaneous erase operation can be performed. As described above, the common erase gate electrode 6' is formed in a plurality of rows, so that a decrease in width of a cell pitch and a low resistance of the erase gate electrode 6' can be achieved, thus realizing high integration and a high-speed operation.

Figure 8:
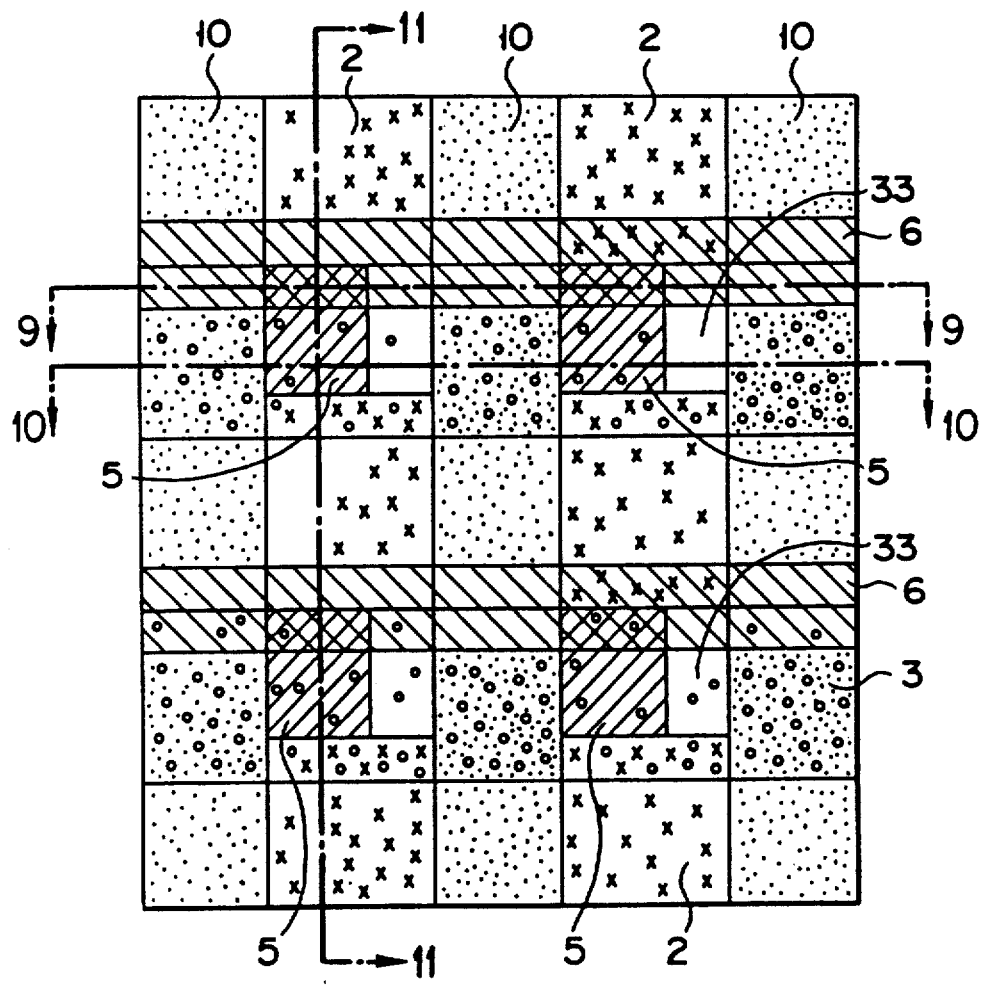
FIG. 8 is a view showing a planar pattern of a part of a cell array in a nonvolatile semiconductor memory according to another embodiment of the present invention.
Figure 9:
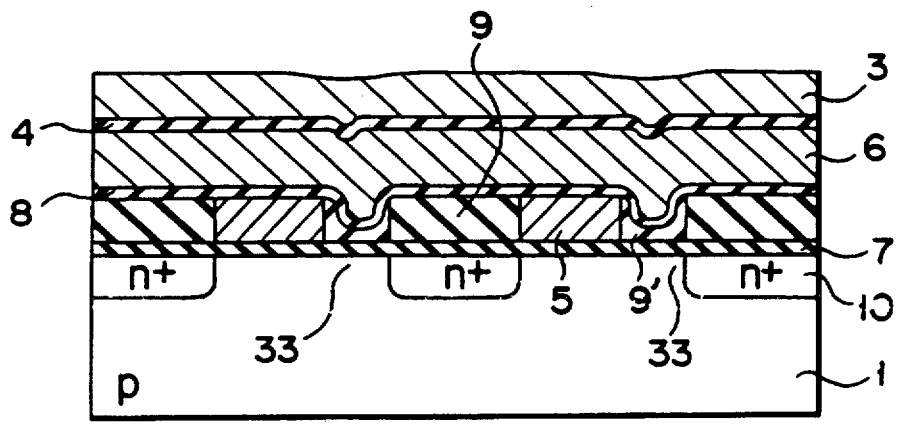
FIG. 9 is a sectional view taken along the line of B—B of FIG. 8.
Figure 10:
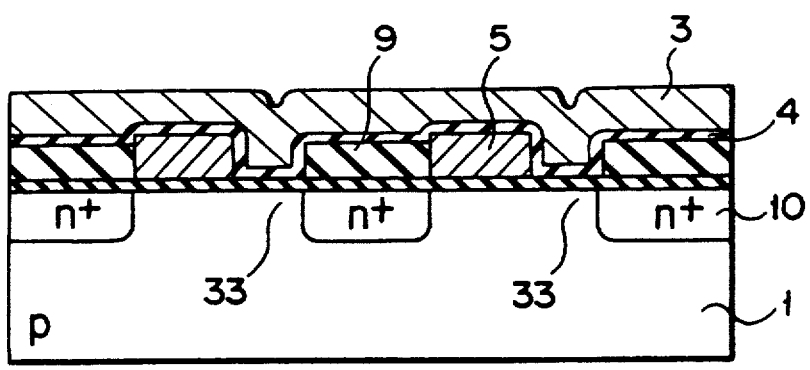
FIG. 10 is a sectional view taken along the line of C—C of FIG. 8.

FIGS. 8 to 11 show a part of a cell array in an EEPROM integrated circuit using another cell transistor different from that shown in FIGS. 2A to 2C. FIG. 8 shows a planar pattern of the cell array. FIGS. 9 and 10 show sectional structures taken along the lines of B—B and C—C in a row line (word line) direction, respectively, and FIG. 11 shows a sectional structure taken along the line of D—D in a column line (data line) direction. FIG. 12 shows an equivalent circuit of the cell transistor.

More specifically, this EEPROM integrated circuit includes a cell array in which cell transistors each having source and drain regions element-isolated by an element isolation region 2 without a bird beak formed in a semiconductor substrate are formed in a matrix form. The cell transistor includes a gate electrode having a three-layered structure on the semiconductor substrate. In this gate electrode having a three-layered structure, a three-layer gate electrode 3 is formed to oppose first- and second-layer gate electrodes 5 and 6 through a gate insulating film 4 having a high breakdown voltage. The first-layer gate electrode 5 serves as a floating gate electrode, the second-layer gate electrode 6 serves as an erase gate electrode, and the third-layer gate electrode 3 serves as a control gate electrode.

The gate insulating film 4 having a high breakdown voltage consists of a composite film obtained by stacking, e.g., two or more oxide and nitride films, or of only an oxide film. Reference numeral 7 denotes a gate insulating film between the semiconductor substrate surface and the floating gate electrode 5; 8, a tunnel insulating film between the floating and erase gate electrodes 5 and 6; and 9, an insulating film buried on the semiconductor substrate on the source/drain region 10, e.g., a CVD oxide film. Reference numeral 9' denotes an insulating film buried on the element isolation region 2, e.g., a CVD oxide film on the semiconductor substrate.

The erase and control gate electrodes 6 and 3 are arranged to be parallel to each other, and to be perpendicular to a channel widthwise direction between the source/drain regions 10. The common source and drain regions of the cell transistors adjacent to each other in a channel length direction of the channel region are formed.

The floating gate electrode 5 is formed to have a width shorter than the channel length of the channel region between the source/drain regions 10 in the cell transistors. The floating gate electrode 5 has an offset portion 33 without having a floating gate electrode portion thereabove near the source region (or near the drain region) on the channel region. In this offset portion 33, the control gate electrode 3 is formed to oppose a part of the channel region through the gate insulating film 8, thus forming a selection transistor portion Tr.

In the above-mentioned cell transistor shown in FIGS. 8 to 11, the same effect as that of the cell transistor shown in FIGS. 2A to 2C can be obtained. A capacitance between the floating and control gate electrodes 5 and 3 is increased, and writing characteristics can be improved. In addition, since the selection transistor portion Tr is arranged near the source region of the cell transistor, an EEPROM cell which can prevent a write error and a read error in a write or read mode can be realized.

More specifically, an equivalent circuit of this EEPROM cell is shown in FIG. 12. When this EEPROM cell is used in the cell array shown in FIG. 5, even if hot electrons are generated near the source of the non-selected memory cell during a data write operation of the selected memory cell, electrons are not injected into the floating gate electrode of the non-selected memory cell, thus preventing a write error. This non-selected memory cell is connected to the same word line to which the selected memory cell is connected, and the source of the non-selected memory cell is connected to a selected column line to which the drain of the selected memory cell is connected.

In a read mode, when excessive positive electric charges are accumulated in the floating gate electrode of the non-selected memory cell due to overerase, the channel under the floating gate electrode is inverted to be of a depletion type, and the selected memory cell may often be determined that it is in an erase state even if it is in a write state. This non-selected memory cell is connected to the column line to which the selected memory cell is connected, and is also connected to a non-selected word line. In this case, if the cell transistor has no selection transistor portion, the overerase must be prevented by an erase circuit. However, when the cell transistor has the selection transistor portion as described above, even if the channel under the floating gate electrode is inverted due to overerase, the channel under the control gate electrode on the source side is not inverted, so that a read error can be prevented without preventing the overerase by arranging an erase circuit.

Figure 13A:
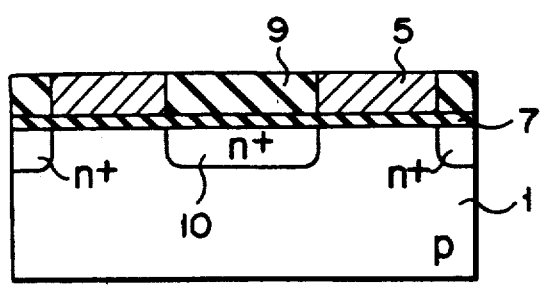
FIGS. 13A to 13F are sectional views which show the steps in manufacturing the nonvolatile semiconductor memory of the present invention according to a third manufacturing method, and the steps in manufacturing the cell transistor shown in FIGS. 8 to 11.
Figure 13D:
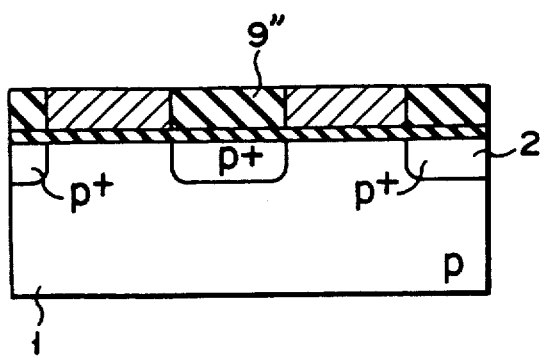
Figure 13B:
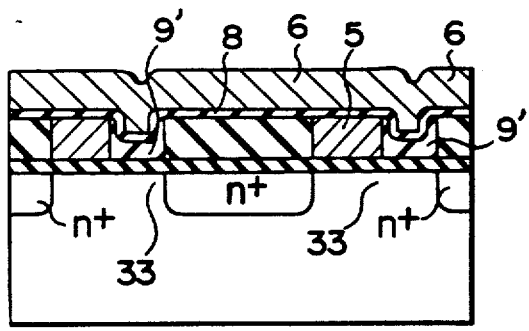
Figure 13E:
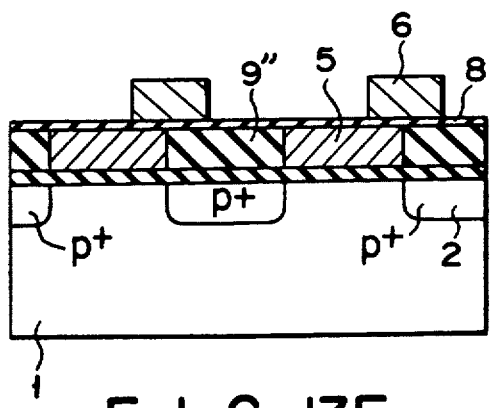
Figure 13C:
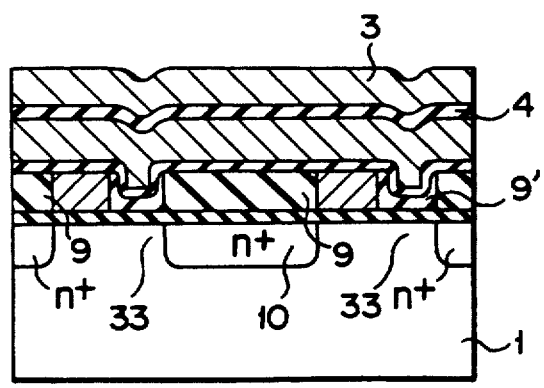

A method of manufacturing the cell transistor shown in FIGS. 8 to 12 without employing a LOCOS method will be described hereinafter with reference to FIGS. 13A to 13C showing a sectional structure taken along the line of B—B in the word line direction in FIG. 8, and FIGS. 13D to 13F showing a sectional structure taken along the line of D—D in the column line direction in FIG. 8.

By the same steps as in FIGS. 3A to 3C, FIGS. 3K to 3M, and FIGS. 6A and 6F, the width of a floating gate electrode 5 is determined, and a p+-type element isolation region 2 is formed.

In the substantially same manner as in the steps shown in FIGS. 3C and 3M, a third insulating film (e.g., CVD film) 9" having a thickness substantially equal to that of the first polysilicon film 5 is buried on the element isolation region 2 on the substrate, as shown in FIGS. 13A and 13D.

As shown in FIGS. 13B and 13E, one end portion near the source region (or near the drain region) of the first polysilicon film 5 is etched to form the floating gate electrode 5 having a width shorter than the channel length of a channel region between the source and drain regions. At the same time, the offset portion 33 above which a floating gate is not formed is formed near the source or drain region on the channel region. Then, if the second gate insulating film 8 having a thickness of about 300 Å serving as a tunnel insulating film is deposited on the semiconductor substrate, the substrate is located on the offset portion, and its oxidation rate is as slow as substantially half that of the floating gate electrode 5 consisting of polysilicon. Therefore, the second gate insulating film 8 serving as a tunnel insulating film is deposited on the offset portion 33 to have a thickness of only about 150 Å. If a high voltage of about 20 V is applied to the erase gate electrode 6 (to be described later), the gate may be undesirably broken.

In order to prevent the breakage, by the same steps as in FIGS. 6B and 6G, the fourth insulating film (e.g., CVD film) 9' is buried on the substrate on the offset portion 33 to have a thickness smaller than that of the floating gate electrode 5.

Then, the second gate insulating film 8 serving as a tunnel insulating film is deposited on the semiconductor substrate to have a thickness of about 300 Å, and the second polysilicon film 6 is deposited on the second gate insulating film 8. The second polysilicon film 6 is etched into stripes each having a predetermined width to have a portion which opposes a part of the floating gate electrode 5 in the row direction of the cell array, thus forming the erase gate electrode 6.

Then, if an exposed portion of the fourth insulating film 9' except for a portion under the erase gate electrode 6 is left, the threshold voltage of the selection transistor portion Tr (to be described later) becomes too high. Therefore, the exposed portion of the fourth insulating film 9' except for the portion under the erase gate electrode 6 is removed.

Figure 13F:
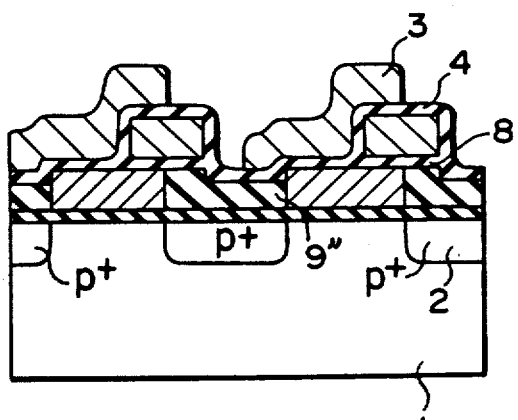

As shown in FIGS. 13C and 13F, the third gate insulating film 4 having a three-layered structure (e.g., oxide film/nitride film/oxide film) is formed on the semiconductor substrate, and on the offset portion 33 from which the exposed portion of the fourth insulating film 9' is removed. In this case, the half or more CVD oxide film having a large thickness is left on the n+-type region 10 and the element isolation region 2, and the third gate insulating film 4 is deposited on this CVD oxide film. Therefore, the dielectric breakdown of this portion can be sufficiently assured.

Then, the third polysilicon film 3 is deposited on the third gate insulating film 4. The third polysilicon film 3 is etched into stripes each having a predetermined width to oppose the floating and erase gate electrodes 5 and 6 in the row direction of the cell array, thus forming the control gate electrode 3. At the same time, in the offset portion 33, the selection transistor portion Tr in which the control gate electrode 3 opposes a part of the channel region through the third gate insulating film 4 is formed.

Figure 14:
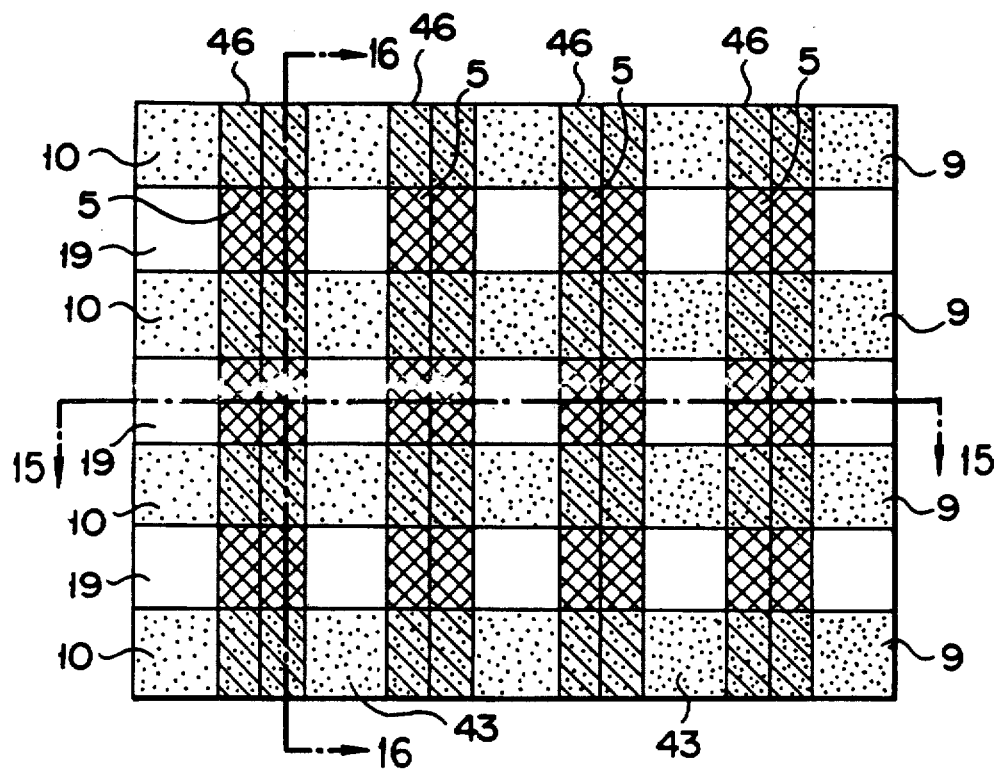
FIG. 14 is a view showing a planar pattern of a part of a cell array in a nonvolatile semiconductor memory according to still another embodiment of the present invention.
Figure 15:
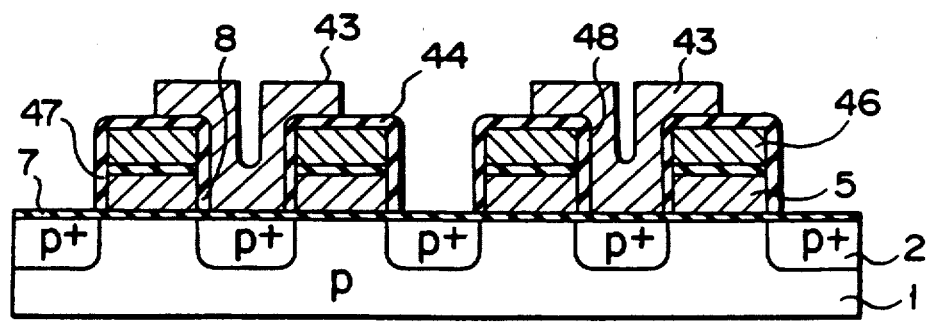
FIG. 15 is a sectional view taken along the line of B—B of FIG. 14.

FIGS. 14 to 16 show a part of a cell array in an EEPROM integrated circuit using another cell transistor different from that in FIGS. 2A to 2C. FIG. 14 shows a planar pattern of the cell array. FIG. 15 shows a sectional structure taken along the line of B—B in the column line (data line) direction, and FIG. 16 shows a sectional structure taken along the line of C—C in the row line (word line) direction.

More specifically, this EEPROM integrated circuit includes a cell array, in which the cell transistors each having source and drain regions which are element-isolated from each other by an element isolation region 2 having no bird beak are formed in a semiconductor substrate 1 and arranged in a matrix form. The cell transistor includes a gate electrode having a three-layered structure on the semiconductor substrate. In the gate electrode having the three-layered structure, a three-layer gate electrode 43 is arranged to oppose first- and second-layer gate electrodes 5 and 46 through a tunnel insulating film 8 and a gate insulating film 44 which have a high breakdown voltage. The first-layer gate electrode 5 serves as a floating gate electrode, the second-layer gate electrode 46 serves as a control gate electrode, and the third-layer gate electrode 43 serves as an erase gate electrode.

The gate insulating film 44 having a high breakdown voltage consists of a composite film obtained by stacking, e.g., two or more oxide and nitride films, or of only an oxide film. Reference numeral 7 denotes a gate insulating film between the semiconductor substrate surface and the floating gate electrode 5; 8, the tunnel insulating film between the floating and erase gate electrodes 5 and 43; 9, an insulating film buried on a source/drain region 10, e.g., a CVD oxide film formed by CVD on the semiconductor substrate; and 47, a gate insulating film between the floating and control gate electrodes 5 and 46.

The erase and control gate electrodes 43 and 46 are arranged to be parallel to each other, and to be perpendicular to the channel widthwise direction of a channel region between the source and drain regions. The common source and drain regions of the cell transistors adjacent to each other in the channel length direction of the channel region are formed.

In the above-mentioned cell array, the common source and drain regions of the cell transistors adjacent to each other in a single row are formed, and the common source/drain regions 10 are formed for the column memory cells along the column direction to serve as column lines (data lines). The common row erase gate electrodes 43 in the memory cells are formed along the row direction to form erase lines. In addition, the common row control gate electrodes 46 in the memory cells are formed along the row direction to be parallel to the erase lines, thus forming word lines (control gate lines).

In the above-mentioned cell transistor shown in FIGS. 14 to 16, the same effect as in the cell transistor shown in FIGS. 2A to 2C can be obtained. In addition, since the common erase gate electrode 43 is formed for the cell transistors in two rows in each pair consisting of two rows adjacent to each other, a block erase operation in units of two word lines can be performed.

When the common erase gate electrodes 43 are formed for the cell transistors in the rows in a plurality of pairs, or when the plurality of pairs of the erase gate electrodes 43 in units of two word lines are connected to each other, or when the common erase gate electrodes 43 are formed for the cell transistors in the rows in each pair consisting of three or more rows adjacent to each other, or when an erase voltage is simultaneously applied to the plurality of pairs of the erase gate electrodes 43 in units of a plurality of word lines, a block erase operation of three or more word lines can be performed.

When the erase gate electrodes 43 in each row or in a plurality of rows are commonly connected, or when the common erase gate electrode 43 is formed for the cell transistors in all the rows, a simultaneous erase operation can be performed.

As described above, when the common erase gate electrode 43 is formed in a plurality of rows, a decrease in width of a cell pitch and a low resistance of the erase gate electrode can be achieved, thus realizing high integration and a high-speed operation.

As described above, the cell array shown in FIG. 17 can be constituted in substantially the same manner as in the cell array shown in FIG. 5, using the EEPROM cell in which the common erase gate electrode is formed in the cell transistors in the two rows. Reference numerals 40-1-1 to 40-4-4 denote memory cells. Reference symbols WL1 to WL4 denote word lines; EL1 and EL2, erase lines, and DL1 to DL5, column lines. In the cell array shown in FIG. 17, the same effect as that of the cell array shown in FIG. 5 can be obtained.

A method of manufacturing the cell transistor shown in FIGS. 14 to 16 without employing LOCOS method will be described below with reference to FIGS. 18A to 18F showing a sectional structure along the line of B—B in the column line direction in FIG. 14, and FIGS. 18G to 18L showing a sectional structure taken along the line of C—C in the row line direction in FIG. 14.

Figure 18G:
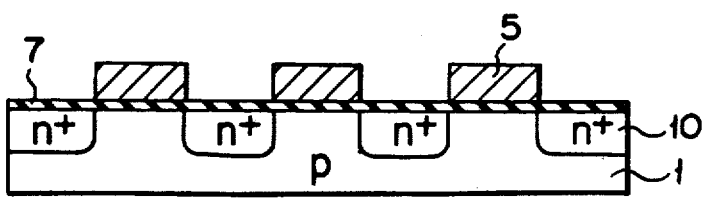

As shown in FIGS. 18A and 18G, for example, ions are implanted in an entire surface of the p-type semiconductor substrate 1 to control the threshold voltage of the cell transistor. Thereafter, the first gate insulating film (e.g., thermal oxide film) 7 having a thickness of about 300 Å is formed, and the first polysilicon film 5 is deposited on the first gate insulating film 7. The first polysilicon film 5 is patterned into stripes each having a predetermined width in the column direction of the cell array to determine the length of the floating gate electrode. Then, using the first polysilicon film 5 patterned into a striped shape in the column direction as a mask, a high-concentration $n^+$-type impurity diffusion region of a conductivity type opposite to that of the substrate is formed in the semiconductor substrate, thus forming a source/drain region 10 of the cell transistor.

Figure 18H:
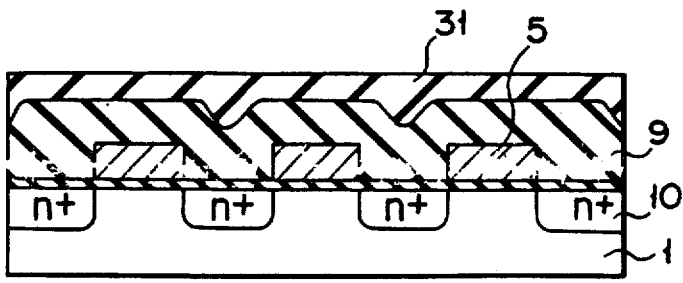

Then, the first insulating film 9 having a thickness substantially equal to that of the first polysilicon film 5 is buried on the substrate between the first polysilicon films patterned into a striped shape (on the substrate on the $n^+$-type region 10). In this case, as shown in FIGS. 18B and 18H, first, the CVD oxide film 9 having a thickness larger than that of the first polysilicon film 5 is formed. A resist 31 is applied on the thick CVD oxide film to flatten the surface. The etching ratio of the resist 31 and the CVD oxide film 9 may be 1:1.

Figure 18I:
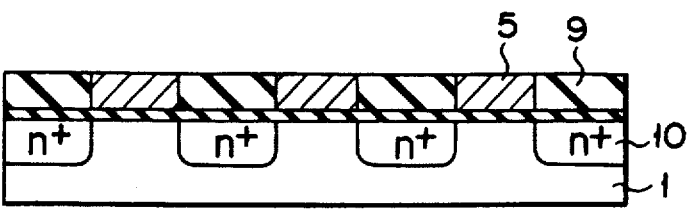

The resist 31 and the CVD oxide film 9 are simultaneously etched up to an upper surface of the first polysilicon film 5. Therefore, as shown in FIGS. 18C and 18I, the CVD oxide film 9 having a thickness substantially equal to that of the first polysilicon film 5 can be buried on the substrate on the $n^+$-type region 10.

Figure 18J:
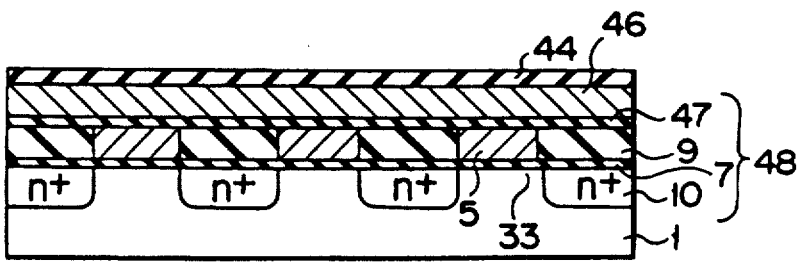

As shown in FIGS. 18D and 18J, the second gate insulating film (having a three-layered structure consisting of, e.g., an oxide film/nitride film/oxide film structure, or of only an oxide film) 47 is formed on the semiconductor substrate. In addition, the second polysilicon film 46 is deposited on the second gate insulating film, and the third gate insulating film (having a three-layered structure consisting of e.g., an oxide film/nitride film/oxide film structure, or of only an oxide film) 44 is formed on the second polysilicon film.

Figure 18K:
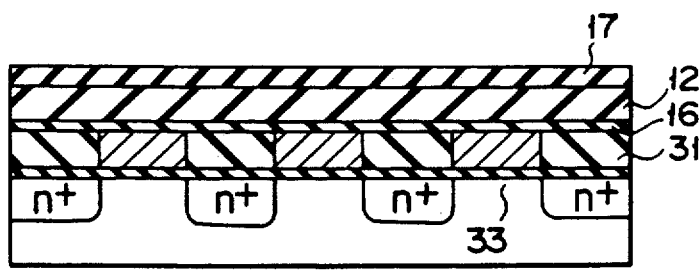

Then, a resist is patterned on the third gate insulating film 44. As shown in FIGS. 18E and 18K, using the resist as a mask, the third gate insulating film 44, the second polysilicon film 46, the second gate insulating film 47, and the first polysilicon film 6 are patterned into stripes each having a predetermined width in the row direction of the cell array to determine the widths of the control and floating gate electrodes. At the same time, the control and floating gate electrodes having a two-layered structure are formed. At this time, the buried CVD oxide film 9 is left without being etched, and a prospective element isolation region 2 is exposed.

In this state, using the second insulating film 44 patterned into a striped shape in the row direction as a mask, impurity ions of the same conductivity type as that of the substrate are implanted in the semiconductor substrate, and the $p^+$-type element isolation region 2 having no bird beak is formed to define the element region in the column direction. At this time, since the $n^+$-type region 10 is protected by the thick CVD oxide film 9 formed on the region 10, the region 10 can be free from the ion implantation.

Figure 18L:
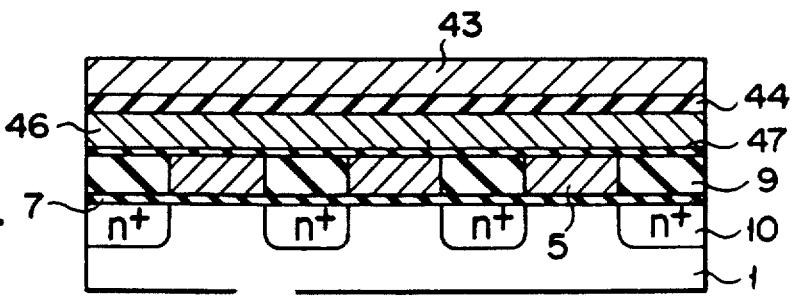

As shown in FIGS. 18F and 18L, the fourth gate insulating film 8 serving as a tunnel insulating film is formed on the semiconductor substrate including a side surface portions of the gate electrode having the two-layered structure to have a thickness of about 300 Å.

Then, the third polysilicon film 43 is deposited on the fourth gate insulating film 8, and the third polysilicon film 43 is etched into a striped pattern along the row direction of the cell array to form the erase gate electrode 43 having a portion which opposes one side surface of the floating gate electrode 5 and side surfaces of the control gate electrode 46. In this case, the erase gate electrode 43 may oppose the side surfaces of the floating gate electrode 5, so that an adverse effect by mask misalignment of the erase and floating gate electrodes 43 and 45 is negligible.

According to the above-mentioned method shown in FIGS. 18A to 18F and FIGS. 18G to 18L, the same effect as in the method shown in FIGS. 3A to 3J and FIGS. 3K to 3T can be obtained.

As described above, a high-intensity electric field is applied to the tunnel insulating film 8 between the floating and erase gate electrode 5 and 43 in an erase mode. Therefore, the film 8 must be highly reliable In the cell transistor manufactured by the steps shown in FIGS. 3A to 3J, however, the third polysilicon film 43 is deposited on the tunnel insulating film immediately after the tunnel insulating film 8 is grown on the semiconductor substrate including the side surface of the gate electrode having the two-layered structure. Therefore, there is no step such as double or overlap oxidation which causes degration of the quality of the films, thus forming the highly reliable tunnel insulating film 8.

A method of manufacturing the cell transistor having control and erase gate electrodes located at positions different from those in the cell transistor shown in FIGS. 14 to 16, without employing a LOCOS method, will be described hereinafter with reference to FIGS. 19A to 19K showing a sectional structure along the column line direction, and FIGS. 19L to 19V showing a sectional structure along the word line direction.

Figure 19A:
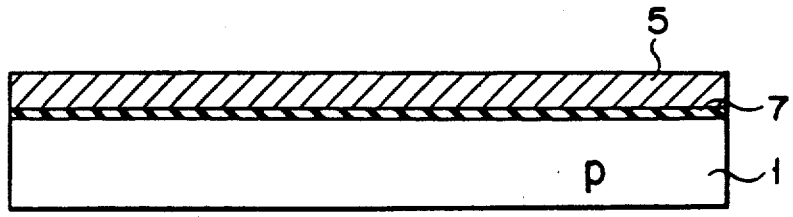
FIGS. 19A to 19V are sectional views showing the steps in manufacturing the nonvolatile semiconductor memory of the present invention according to a fifth manufacturing method.
Figure 19B:
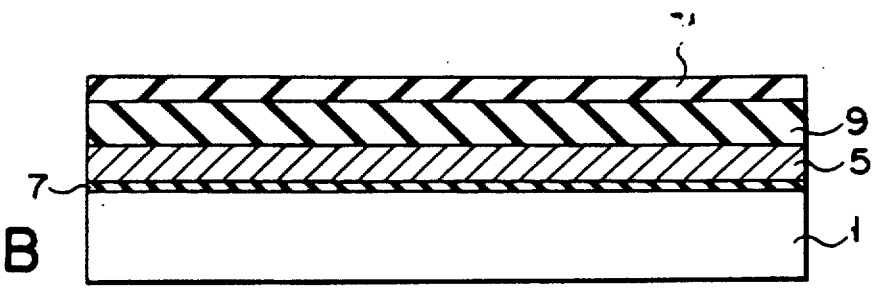
Figure 19C:
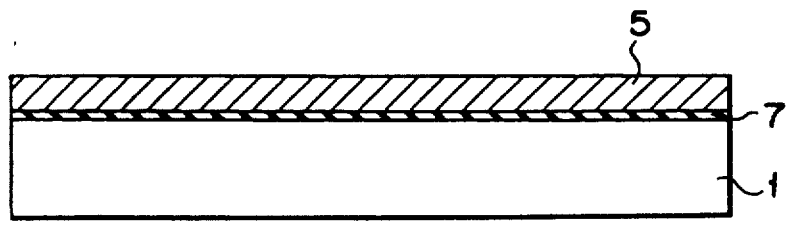
Figure 19D:
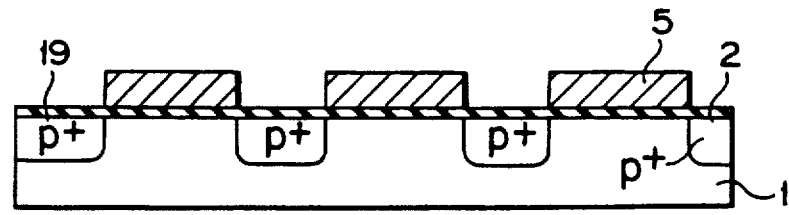
Figure 19E:
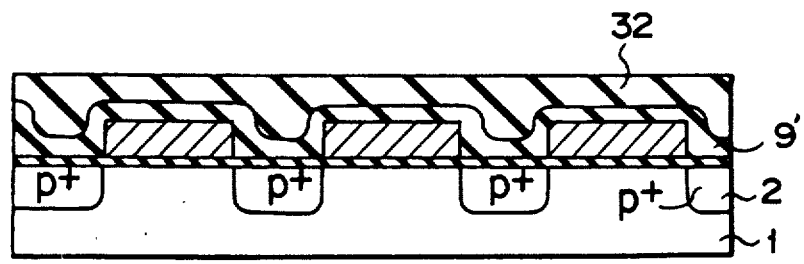
Figure 19F:
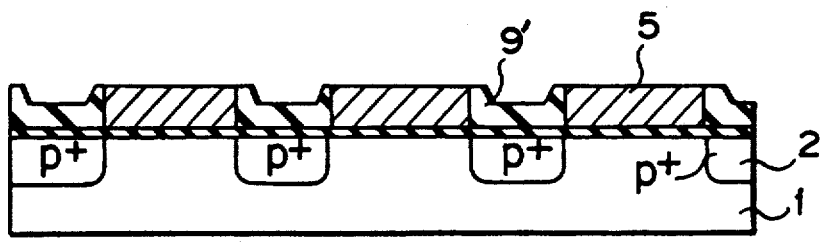

After the steps shown in FIGS. 19A to 19C, and FIGS. 19L to 19N which are the same as in FIGS. 18A to 18C, and FIGS. 18G and 18J, a resist is patterned on the first polysilicon film. As shown in FIGS. 19D and 19O, using the resist as a mask, this first polysilicon film 5 is patterned into stripes each having a predetermined width along the row direction of the cell array to determine the width of the floating gate electrode. At this time, the buried CVD oxide film 9 is left without being etched.

In this state, using the first polysilicon film 5 patterned into a striped shape in the row direction and the CVD oxide film 9 as masks, impurity ions of the same conductivity type as that of the substrate are implanted in the semiconductor substrate, and the $p^+$-type element isolation region in the column direction.

As shown in FIGS. 19E and 19P, and FIGS. 19F and 19Q, the second insulating film (e.g., CVD film) 9′ having a thickness of about 1,000 Å is deposited, in substantially the same manner as in the steps shown in FIGS.

6B and 6G. Thereafter, a resist 32 is applied and patterned so as to flatten the surface. In addition, the second insulating film 9' is etched until an upper surface of the first polysilicon film 5 is exposed, and the third insulating film 9' is buried on the substrate on the element isolation region 2 to have a thickness slightly smaller than that of the first polysilicon film 5. Note that the thickness of the third insulating film 9' is slightly smaller than that of the first polysilicon film 5 because the control gate electrode 46 is formed to oppose parts from a part of the upper surface to a part of the side surfaces of the floating gate electrode 5, as will be described later.

Figure 19G:
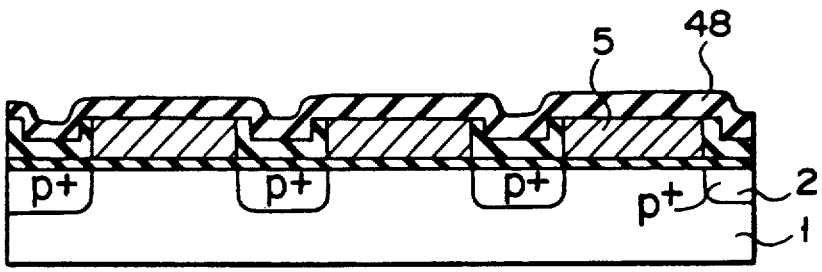
Figure 19H:
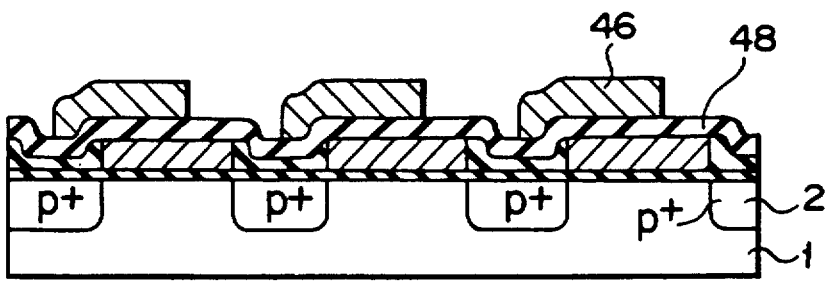

As shown in FIGS. 19G and 19R, the second gate insulating film (e.g., a three-layered structure consisting of an oxide film/nitride film/oxide film structure) 48 is formed on the semiconductor substrate. In addition, the second polysilicon film 46 is deposited on the second gate insulating film 48, and the second polysilicon film 46 is etched into stripes each having a predetermined width to oppose parts from a part of the upper surface to a part of the side surfaces of the floating gate electrode 5 along the row direction of the cell array, thus forming the control gate electrode 46, as shown in FIGS. 19H and 19S.

Figure 19I:
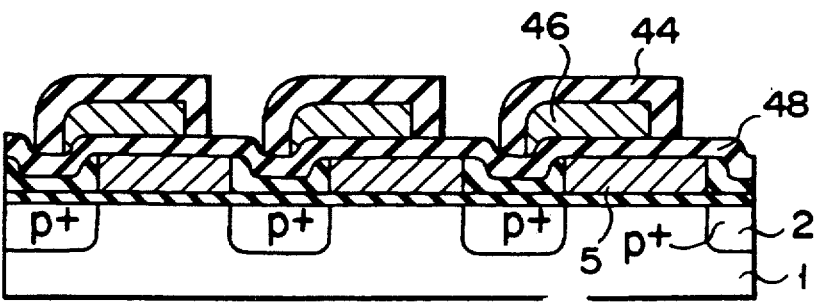

As shown in FIGS. 19I and 19T, the third gate insulating film (e.g., only an oxide film) 44 having a thickness which falls in the range of 500 to 1,000 Å is formed on the semiconductor substrate to cover the control gate electrode 46. In this case, the thickness of the third gate insulating film 44 is preferably as small as possible in the range wherein a predetermined breakdown voltage can be obtained. At this time, the portion on the second gate insulating film 48 having a third-layered structure (e.g., oxide film/nitride film/oxide film) is hardly oxidized.

As shown in FIGS. 19J and 19U, an exposed portion of the second gate insulating film 48 except for the portion under the control gate electrode 46 covered with the third gate insulating film 44 is etched until the upper surface of the floating gate electrode 5 is partially exposed. When an etching gas having a large etching ratio of a nitride film is used at this time, the third gate insulating film 44 is hardly etched.

As shown in FIGS. 19K and 19V, the fourth gate insulating film (e.g., only an oxide film) 8 serving as a tunnel insulating film is formed on the exposed floating gate electrode 5 to have a thickness of about 300 Å. Thereafter, the third polysilicon film 43 is deposited on the semiconductor substrate, and the third polysilicon film 43 is etched into a striped pattern along the row direction of the cell array to form the erase gate electrode 43 having a portion which opposes the upper surface of the floating gate electrode 5 and the side surface of the control gate electrode 46, e.g., to form separate erase gate electrodes in units of rows. In this case, the erase gate electrode 43 may cover the tunnel insulating film 8, and an adverse effect by mask misalignment of the erase and floating gate electrodes 43 and 5 is negligible.

According to the above-mentioned method shown in FIGS. 19A to 19K and FIGS. 19L to 19V, the same effect as in the method shown in FIGS. 6A to 6E and FIGS. 6F to 6J can be obtained. The memory cell formed as shown in FIGS. 19L and 19V can constitute the cell array shown in FIG. 5. Since the thickness of the third gate insulating film 44 between the control and erase gate electrodes 46 and 43 is as large as about 500 to 1,000 521, the selected word line in an erase mode can be set at the ground potential with no problem.

Although the erase gate electrode 43 to which a high voltage of about 20 V is applied is located above the element isolation region 2, the thick second insulating film 9' is buried on the substrate on this element isolation region, so that the breakdown voltage of this portion is high, thus improving reliability.

Figure 20:
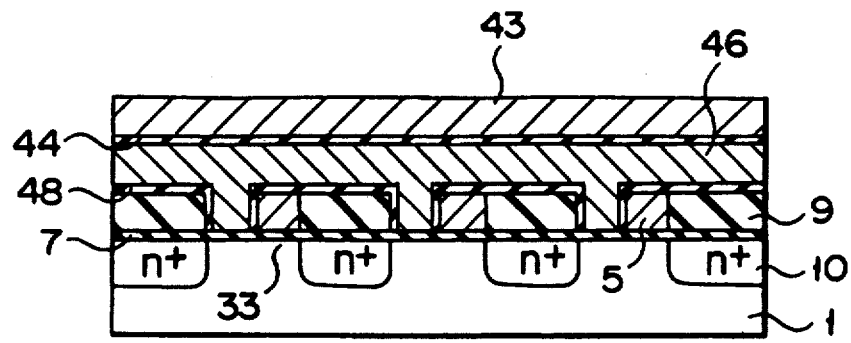
FIG. 20 is a sectional view, taken along the word line direction, which shows a part of a cell array in a nonvolatile semiconductor memory according to still another embodiment of the present invention.

FIG. 20 shows a sectional structure of the selection transistor portion along the row line (word line) direction in a part of the cell array in the EEPROM integrated circuit using another cell transistor different from that shown in FIGS. 14 to 16.

More specifically, in the memory shown in FIGS. 19A to 19V, the cell transistor of this cell array is different from the cell transistor shown in FIGS. 14 to 16, as follows. The width of the floating gate electrode is smaller than the channel length of the channel region in the cell transistor, and an offset portion having no floating gate electrode portion thereabove near the source region (or the drain region) on the channel region is arranged. In this offset portion, the selection transistor portion is formed in which the control gate electrode opposes a part of the channel region through the gate insulating film.

In the above-mentioned cell transistor shown in FIG. 20, the same effect as that of the cell transistor shown in FIGS. 14 to 16 can be obtained. In addition, since the selection transistor portion is formed near the source region of the cell transistor, when this EEPROM cell is used in the cell array shown in FIG. 5, an EEPROM cell which can prevent a write error or a read error in a write or read mode can be realized as in the case wherein the EEPROM cell shown in FIGS. 8 to 12 are used.

A method of manufacturing the cell transistor shown in FIG. 20 without employing a LOCOS method will be described below. In the steps which are the same as the steps shown in FIGS. 18A to 18C and FIGS. 18G to 18I, the width of the floating gate electrode 5 is determined to form an $n^+$-type source/drain region 10. Then, a first insulating film (e.g., CVD film) having a thickness substantially equal to that of the first polysilicon film 5 is buried on the source/drain region 10 on the substrate.

Then, one end portion near the source region (or the drain region) of the first polysilicon film 5 is etched into a striped pattern to form the floating gate electrode 5 having a width larger than the channel length of the channel region between source and drain regions is formed. At the same time, an offset portion 33 having no floating gate electrode portion near the source or drain region on the channel region is formed.

As shown in FIGS. 18D and 18E, and FIGS. 18J and 18K, a second gate insulating film 48 having a three-layered structure (e.g., oxide film/nitride film/oxide film) is formed on the semiconductor substrate and the offset portion 33, and a second polysilicon film 46 is deposited on the second gate insulating film 48. The second polysilicon film 46 and the floating gate electrode 46 are simultaneously etched into stripes each having a predetermined width in the row direction of the cell array, thus forming the control and floating gate electrodes 46 and 5. At the same time, in the offset portion 33, the selection transistor portion Tr in which the control gate electrode 46 opposes a part of the channel region through the second gate insulating film 48 is formed.

In the same steps as in FIGS. 18F and 18L, a third gate insulating film 44, a fourth gate insulating film 8 serving as a tunnel insulating film, and an erase gate electrode 43 are formed.

Figure 21:
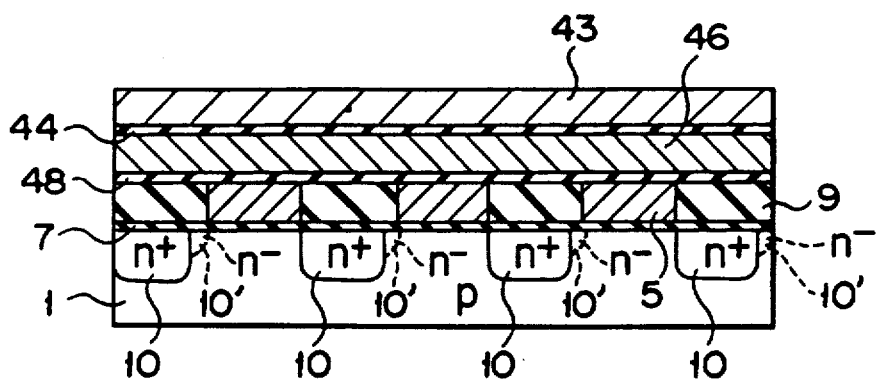
FIG. 21 is a sectional view showing an arrangement of a cell transistor in a nonvolatile semiconductor memory according to still another embodiment of the present invention.

Note that, in the nonvolatile semiconductor memories in the above embodiments, the cell transistor may have a lightly doped drain (LDD) structure wherein an impurity concentration of a portion 10' in the source or drain region near the channel region is lower than that of the remaining portion 10, as shown in FIG. 21.

Figure 22A:
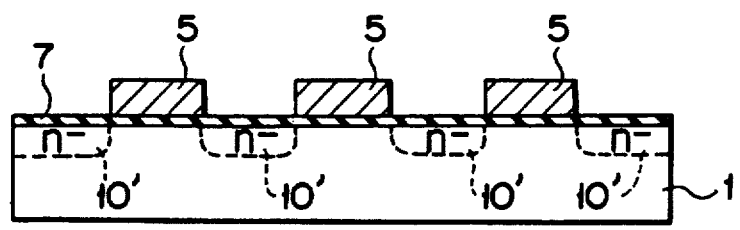
FIGS. 22A and 22B are sectional views showing a first method of manufacturing the cell transistor shown in FIG. 21.
Figure 22B:
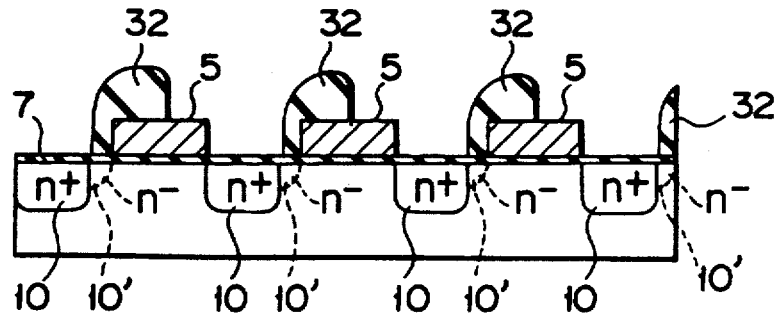

FIGS. 22A and 22B show a sectional structure along the word line direction of the cell array in a first arrangement of a method of manufacturing the cell transistor having the above LDD structure without employing a LOCOS method.

More specifically, as shown in FIG. 22A, for example, ions are implanted in an entire surface of a p-type semiconductor substrate 1 to control the threshold voltage of the cell transistor. Thereafter, a first gate insulating film (e.g., thermal oxide film) - 7 having a thickness of 300 Å is formed, and a first polysilicon film 5 is deposited on the first gate insulating film 7. Then, the first polysilicon film 5 is patterned into stripes each having a predetermined width along the column direction of the cell array to determine the length of a floating gate electrode.

Then, using the first polysilicon film 5 patterned into a striped shape along the column direction as a mask, impurity ions of a conductivity type opposite to that of the substrate are implanted in the semiconductor substrated to form a low-concentration $n^-$-type impurity diffusion region 10' in the source and drain regions.

Then, as shown in FIG. 22B, for example, a resist 32 is formed to cover a portion in the source region near the end portion of the channel region. Impurity ions of a conductivity type opposite to that of the substrate are implanted using the resist 32 as a mask to form high-concentration $n^+$-type impurity diffusion regions 10 in the source and drain regions, thus forming an LDD structure on the source side. Thereafter, the resist 32 is removed, thus completing the cell transistor by the above-mentioned steps.

FIGS. 23A to 23C show a sectional structure along the word line direction of the cell array in a second arrangement of a method of manufacturing the cell transistor having the LDD structure without employing the LOCOS method.

More specifically, by the steps shown in FIGS. 22A and 22B, the first polysilicon film 5 is patterned to determine the length of the floating gate electrode. Impurity ions of a conductivity type opposite to that of the substrate are implanted in the semiconductor substrate using the first polysilicon film 5 as a mask to form the low-concentration $n^-$-type impurity diffusion regions 10' in the source and drain regions.

As shown in FIG. 23A, a CVD oxide film 34 is deposited on the semiconductor substrate. Then, the CVD oxide film 34 is anisotropically etched by RIE (reactive ion etching) under the optimal conditions, so that the CVD oxide film 34 is left on only both the end faces in the length direction of the first polysilicon film 5, as shown in FIG. 23B. Then, the CVD oxide film 34 on one end face in the length direction of the first polysilicon film 5 is masked by a resist 32, and the CVD oxide film 34 on the remaining one end face is removed.

Then, the resist 32 is removed, and impurity ions of a conductivity type opposite to that of the substrate are implanted using the remaining CVD oxide film 34 as a mask to form the high-concentration $n^+$-type impurity diffusion regions 10 in the source and drain regions, as shown in FIG. 23C. Therefore, the LDD structure is formed on the source or drain side. Thereafter, the cell transistor is completed by the above-mentioned steps.

Note that although the steps are slightly complicated in the method shown in FIGS. 23A to 23C, the low-concentration $n^-$-type impurity diffusion region 10' can be controlled by the CVD oxide film 34 and the conditions during RIE, thus forming the LDD structure without mask misalignment.

In the above-mentioned method shown in FIGS. 22A and 22B, and FIGS. 23A to 23C, the order of ion implantation operations to form the low-concentration $n^-$-type impurity diffusion region 10' and the high-concentration $n^+$-type impurity diffusion region 10 may be reversed.

According to this embodiment, in a write mode, the source has an LDD structure in the non-selected memory cell which is adjacent to the selected memory cell in the row direction, and shares the drain and the source of the adjacent selected memory cells. Therefore, hot electrons are not easily generated, thus improving reliability to prevent a write error.

As has been described above, according to the present invention, a finely micropatterned cell can be formed, and high integration can be achieved. In addition, a nonvolatile semiconductor memory having an electrically erasable EEPROM cell and a method of manufacturing the same can be realized.

More specifically, since the cell transistor in the memory according to the present invention includes a gate electrode having a three-layered structure including an erase gate electrode on a semiconductor substrate, data in this memory can be electrically erased. In addition, since the control gate electrode opposes the floating gate electrode through the gate insulating film having a high breakdown voltage, a highly reliable EEPROM cell can be realized.

The cell transistor is element-isolated by the element isolation region having no bird beak and formed without employing a LOCOS method, and a fringe portion of the gate need not be formed. Therefore, a cell area can be as small as that of the conventional EEPROM cell, thus achieving high integration.

In the above-mentioned cell transistor, since the source and drain regions of the cell transistors adjacent to each other in the channel length direction of the common channel region are formed, the number of contact portions between the source and drain regions and the upper wiring layer can be decreased, thus further achieving high integration.

When the erase gate electrode is formed to entirely cover the portions from an upper edge portion (edge portion) of one side to a part of the side surfaces of the floating gate electrode, an erase efficiency is increased by an effect of the edge portion in an erase mode.

Even if the erase gate electrode to which a high voltage of about 20 V is applied is located above the element isolation region, the thick insulating film is buried on the element isolation region on the substrate, so that a breakdown voltage of this portion is high, thus improving reliability.

In the above-mentioned EEPROM cell, although a high voltage is applied to the erase gate electrode during an erase operation, the thickness of the first gate oxide film below the floating gate electrode need not be decreased. Therefore, sufficient writing characteristics equal to those of the EPROM cell can be obtained without decreasing a capacitance between the control and floating gate electrodes which affects the writing characteristics.

In the EEPROM integrated circuit using the above-mentioned EEPROM cells, a window through which ultraviolet rays are emitted need not be formed in a package, so that the circuit can be sealed into a plastic package, thus decreasing cost. When this circuit is mounted on a printed circuit board, and is applied to a system product, data can be updated on the printed circuit board, thus achieving an easy operation.

According to the cell array in the memory in this invention, since the common source and drain regions of the column cell transistors adjacent to each other are formed, micropatterning in the row direction of the cell can be performed, and the number of contact portions in the upper wiring layer with respect to the source and drain regions can be decreased.

Since the common source and drain regions are formed in the column direction in the column memory cells, the number of contact portions in the upper wiring layer with respect to the source and drain regions can be further decreased.

Since the common row erase gate electrodes in the memory cells are formed in a row direction, and the common row control gate electrodes of the memory cells are formed in the row direction so as to be parallel to the erase gate electrodes, the erase and control gate electrodes can be selectively controlled by a common decoder, and an erase operation in units of word lines (block erase) can be performed. Therefore, a decoder exclusively used for an erase operation is not required.

Depending on the selection methods of the erase lines, all bits can be simultaneously erased, or bits can be erased in units of word lines (block erase). More specifically, when an erase voltage is selectively applied to the erase gate electrodes in the rows, the block erase can be performed. When the erase gate electrodes in a plurality of rows are commonly connected and an erase voltage is applied to the common electrode, or when the erase voltage is separately and simultaneously applied to the erase gate electrodes in a plurality of rows, an erase operation can be simultaneously performed with respect to a plurality of or all the cell transistors.

When the erase gate electrode is formed to be common for the cell transistors in two rows in each pair consisting of two rows, a block erase operation in units of two word lines can be performed in the EEPROM of a type for performing a simultaneous erase operation. Therefore, a decrease in width of a cell pitch and a low resistance of the erase gate electrode can be achieved, thus realizing high integration and a high-speed operation.

When the selection transistor portion is formed near the source or drain region of the cell transistor, an EEPROM which can prevent a write error or a read error in a write or read mode can be realized.

Since a high intensity electric field is applied to the tunnel insulating film between the floating and erase gate electrodes in an erase mode, the tunnel insulating film must be highly reliable. In the method according to this invention, however, there is no step such as double or overlap oxidation which causes degradation of the quality of the film. Therefore, a high-quality and high-reliability tunnel insulation film can be formed.

Since the source and drain regions, and the element isolation region are formed using polysilicon layers serving as gates as masks, a margin for mask alignment need not be taken into consideration. Also from this point, a decrease in cell area and high integration can be achieved.

What is claimed is:

1. A nonvolatile semiconductor memory comprising:
   a cell array in which electrically erasable programmable nonvolatile semiconductor memory cells, each using a cell transistor including source and drain regions in a semiconductor substrate, a channel region between said source and drain regions, and a gate electrode having a three-layered structure on said semiconductor substrate, are arranged in a matrix form;
   said gate electrode having the three-layered structure, comprising a first-layer floating gate electrode which opposes a semiconductor substrate surface through a first gate insulating film, and second- and third-layer gate electrodes each of which serves as one of erase and control gate electrodes, said erase gate electrode opposing a part of said floating gate electrode through a tunnel insulating film, and said control gate electrode opposing said floating gate electrode through a second gate insulating film;
   said erase and control gate electrodes arranged parallel to each other in a row direction and perpendicular to said source and drain regions arranged in a column direction array; and
   said cell transistors arranged adjacent to each other in the row direction through the channel region such that the source region of one of the adjacent transistors is shared by the drain region of the other transistor to provide a common source/drain region, the adjacent cell transistors being isolated by an element isolation region formed in the semiconductor substrate between the channel regions.

2. A memory according to claim 1, wherein said second-layer gate electrode is shifted in the column direction with respect to said first-layer floating gate electrode, and an insulating film having a high breakdown voltage is buried between said second-layer gate electrode and said element isolation region on said semiconductor substrate.

3. A memory according to claim 2, wherein said floating gate electrode is shorter than the channel length of said channel region, and has an offset portion having no floating gate electrode portion on said channel region and near said source or drain region, said offset portion having a selection transistor portion in which said control gate electrode is formed to oppose a part of said channel region through a gate insulating film.

4. A memory according to claim 1, wherein said cell array is arranged such that common column source/drain regions, in which common row source and drain regions in cell transistors adjacent to each other are formed, are formed in memory cells in the column direction, common row erase gate electrodes of memory cells are formed in the row direction, and common row control gate electrodes of memory cells are formed in the row direction.

5. A memory according to claim 4, wherein each of said erase gate electrodes is formed to be common to cell transistors in at least two rows adjacent to each other.

6. A memory according to claim 1, wherein said cell array has a plurality of groups, each group including common row erase gate electrodes and an erase voltage is applied to said erase gate electrodes in one of three methods, in the first of which the erase voltage is applied to at least one selected electrode of each row, in the second of which the erase voltage is simultaneously applied to all electrodes of every row in every group, and in the third of which the erase voltage is applied to the rows of electrodes in any selected group.

* * * * *